US006756661B2

(12) United States Patent
Tsuneda et al.

(10) Patent No.: US 6,756,661 B2
(45) Date of Patent: Jun. 29, 2004

(54) SEMICONDUCTOR DEVICE, A SEMICONDUCTOR MODULE LOADED WITH SAID SEMICONDUCTOR DEVICE AND A METHOD OF MANUFACTURING SAID SEMICONDUCTOR DEVICE

(75) Inventors: Kensuke Tsuneda, Kokubunji (JP); Toshio Sugano, Kodaira (JP); Seiichiro Tsukui, Sayama (JP); Kouji Nagaoka, Toubu (JP); Tomohiko Sato, Kokubunji (JP)

(73) Assignees: Hitachi, Ltd., Tokyo (JP); Hitachi Tohbu Semiconductor, Ltd., Gunma (JP)

( * ) Notice: Subject to any disclaimer, the term of this patent is extended or adjusted under 35 U.S.C. 154(b) by 61 days.

(21) Appl. No.: 09/800,503

(22) Filed: Mar. 8, 2001

(65) Prior Publication Data

US 2001/0026009 A1 Oct. 4, 2001

(30) Foreign Application Priority Data

Mar. 24, 2000 (JP) ........................................ 2000-084858

(51) Int. Cl.$^7$ .......................................... H01L 23/495
(52) U.S. Cl. ........................ 257/673; 257/686; 361/702; 315/307
(58) Field of Search ................................ 257/473, 479, 257/673, 679, 686, 672, 692; 438/123, 610; 361/760; 315/307

(56) References Cited

U.S. PATENT DOCUMENTS

| | | | | |
|---|---|---|---|---|
| 5,744,827 A | * | 4/1998 | Jeong et al. ................. | 257/686 |
| 6,097,883 A | * | 8/2000 | Dell et al. ................... | 395/282 |
| 6,190,006 B1 | * | 2/2001 | Kurashima et al. ........... | 347/70 |
| 6,229,202 B1 | * | 5/2001 | Corisis ........................ | 257/666 |
| 6,388,886 B1 | * | 5/2002 | Tobita ......................... | 361/760 |

FOREIGN PATENT DOCUMENTS

| | | | | |
|---|---|---|---|---|
| JP | 333095 | * | 11/1992 | ............ G09G/3/04 |
| JP | 4-350961 | | 12/1992 | |
| JP | 6-37141 | | 2/1994 | |

* cited by examiner

Primary Examiner—Don Wong
Assistant Examiner—Jimmy T. Vu
(74) Attorney, Agent, or Firm—Mattingly, Stanger & Malur, P.C.

(57) ABSTRACT

A memory TCP loaded with four chips (1-bank 16-bit type) is constructed by a tape of one two-layer wiring layer structure, four chips mounted to this tape, etc. Common signal terminals are arranged on one set of two opposed sides, and an independent signal terminal is arranged on another side. The common signal terminals on the two sides are electrically connected to each other common signal wiring. Further, in a DIMM in which this memory TCP is mounted to front and rear sides of a substrate, plural external terminals are formed on one long side of the rectangular substrate, and the memory TCP is mounted such that the independent signal terminal of the memory TCP is arranged along an arranging direction of these external terminals.

30 Claims, 29 Drawing Sheets

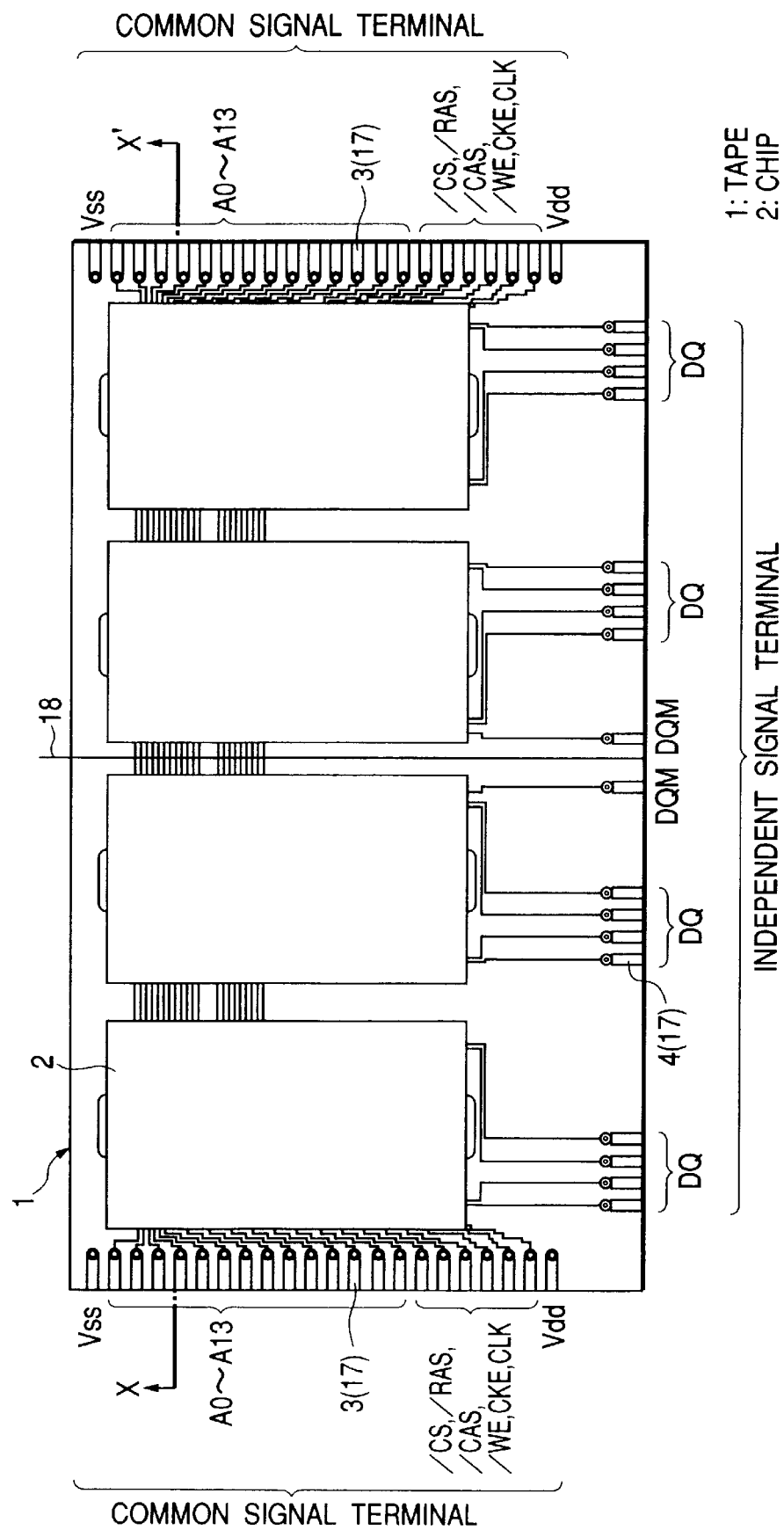

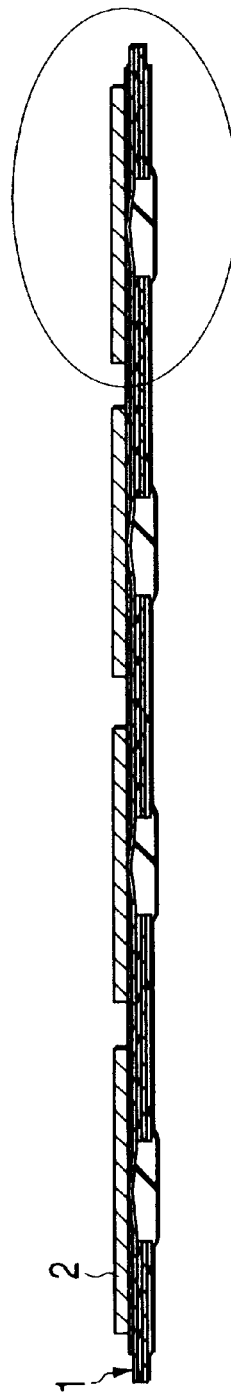
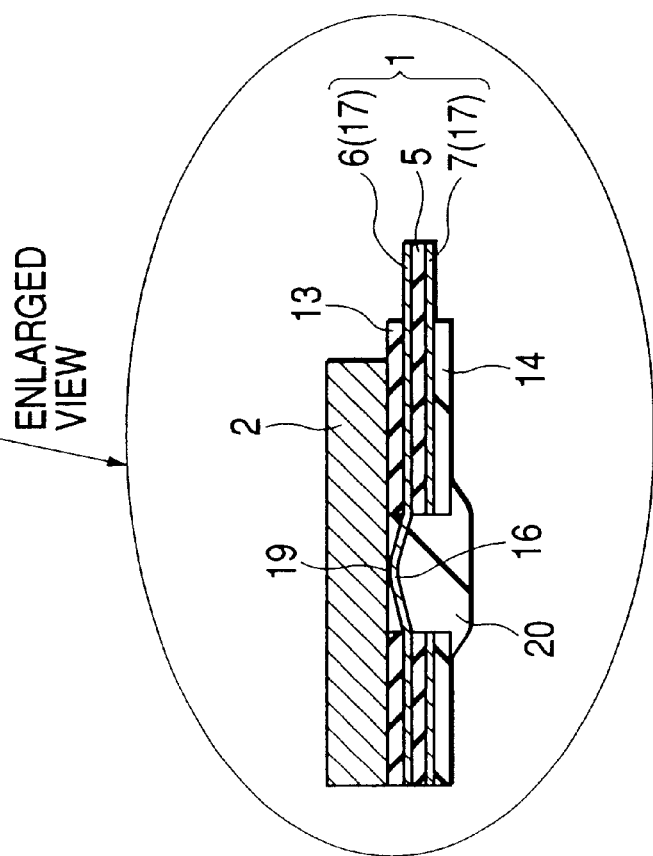
FIG. 3(a)
FIG. 3(b)

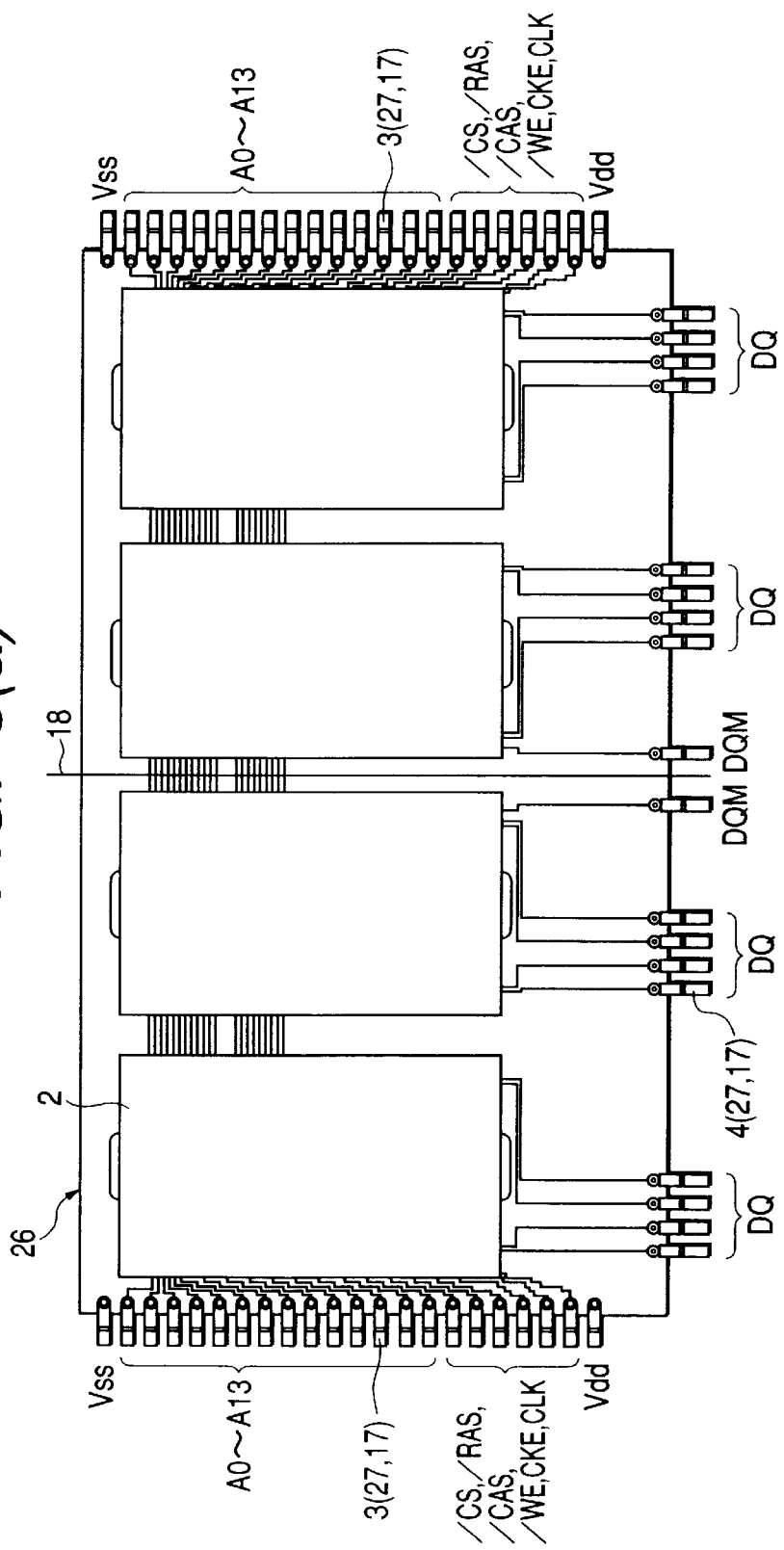

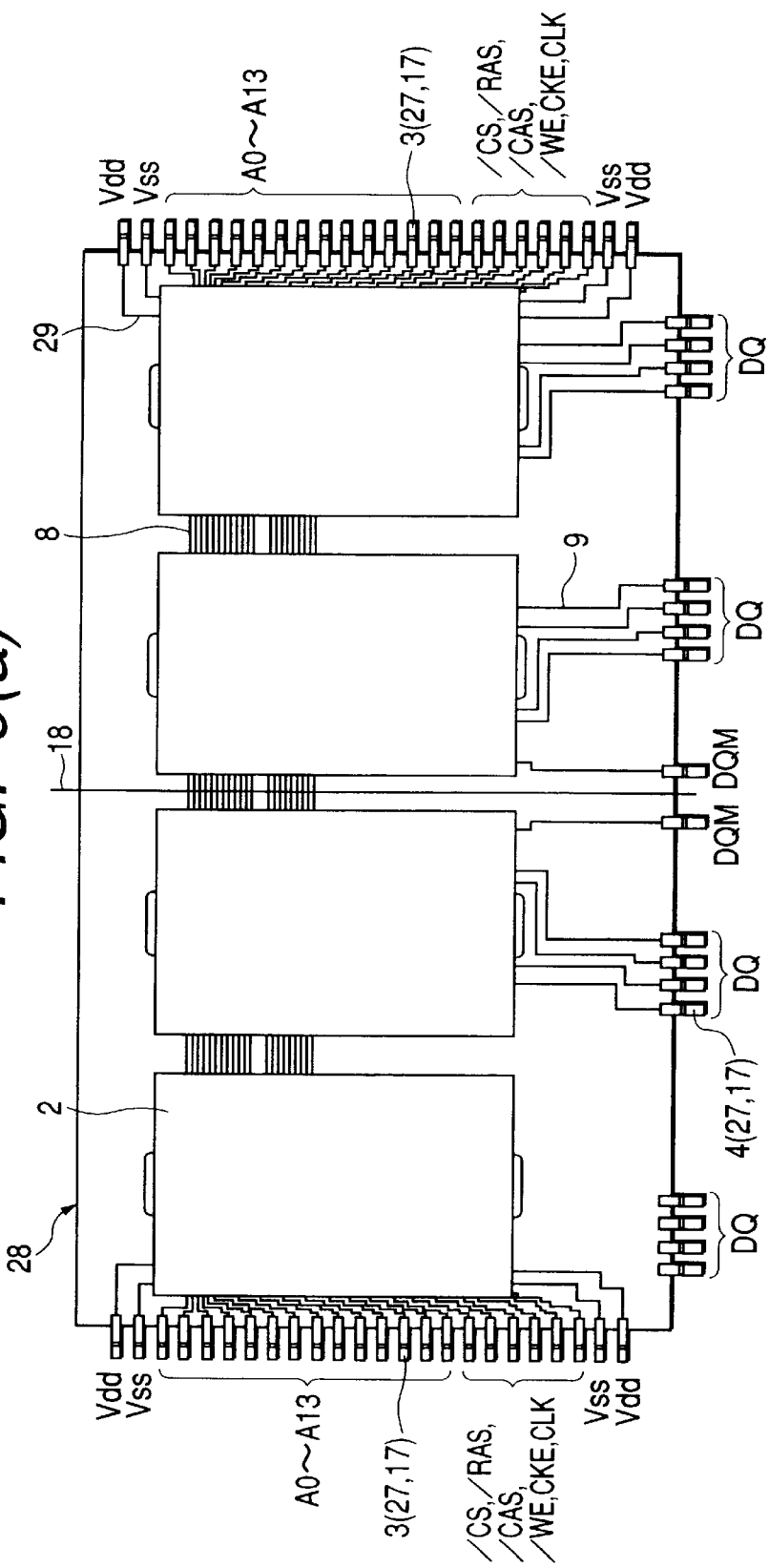

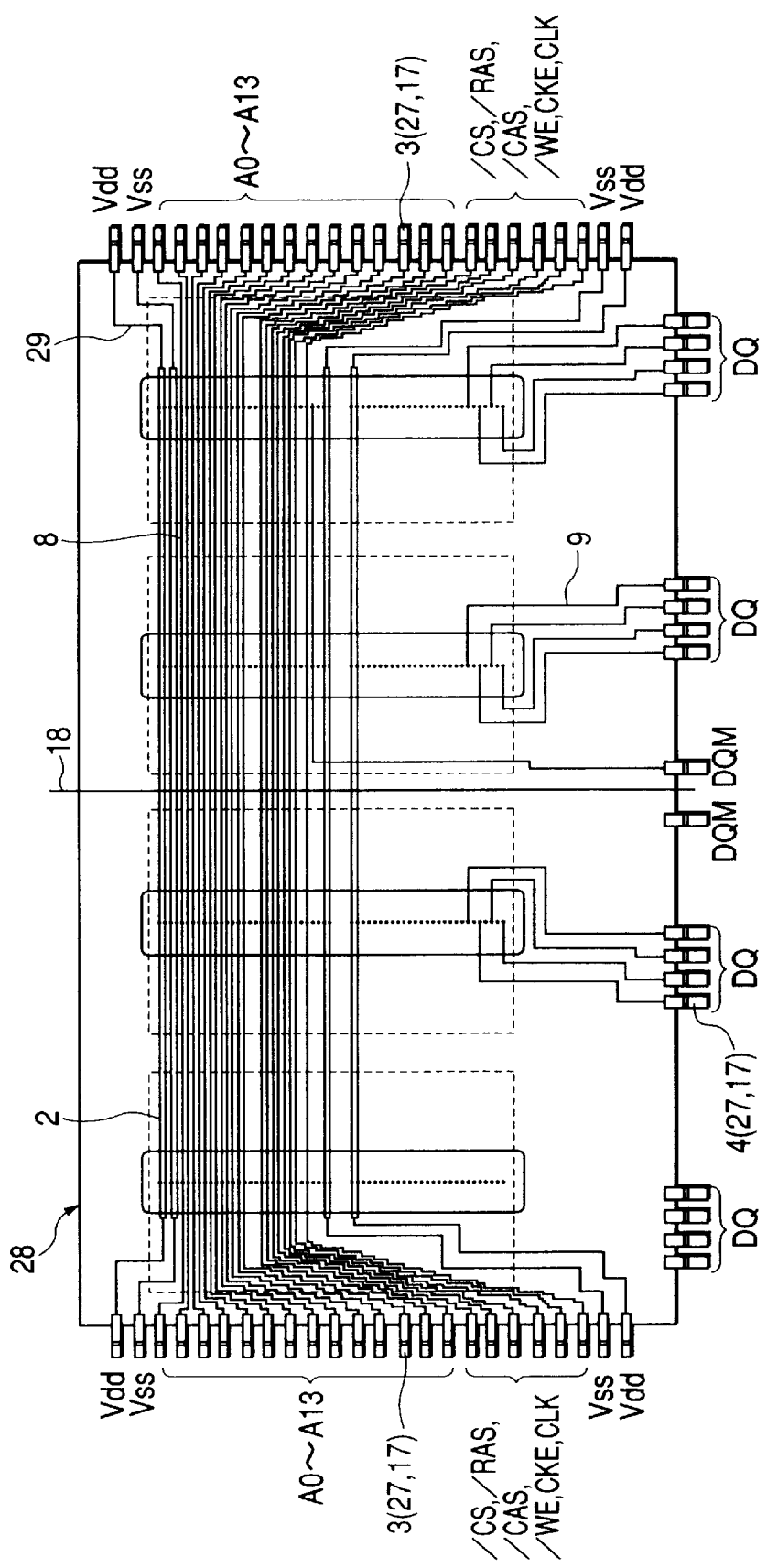

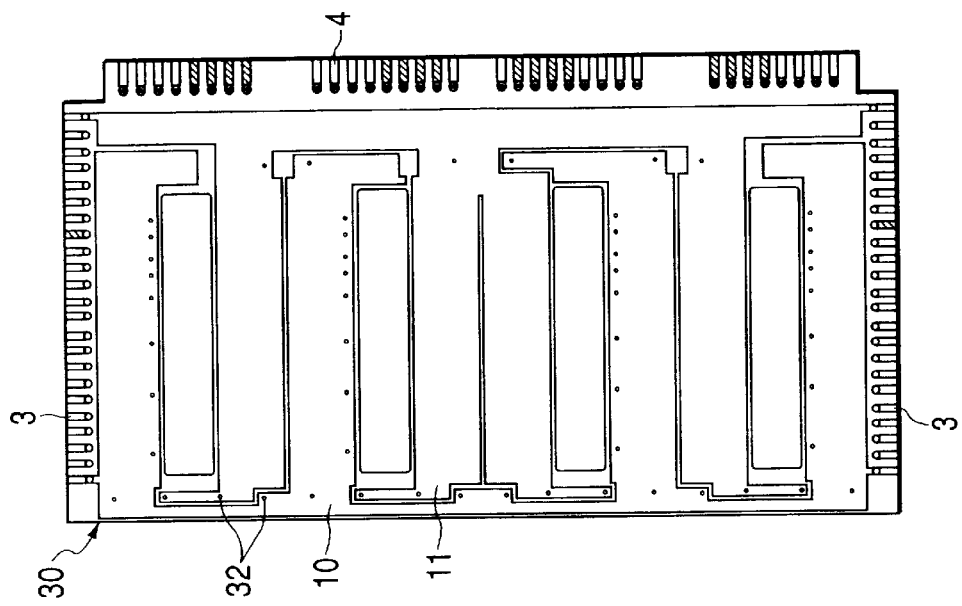
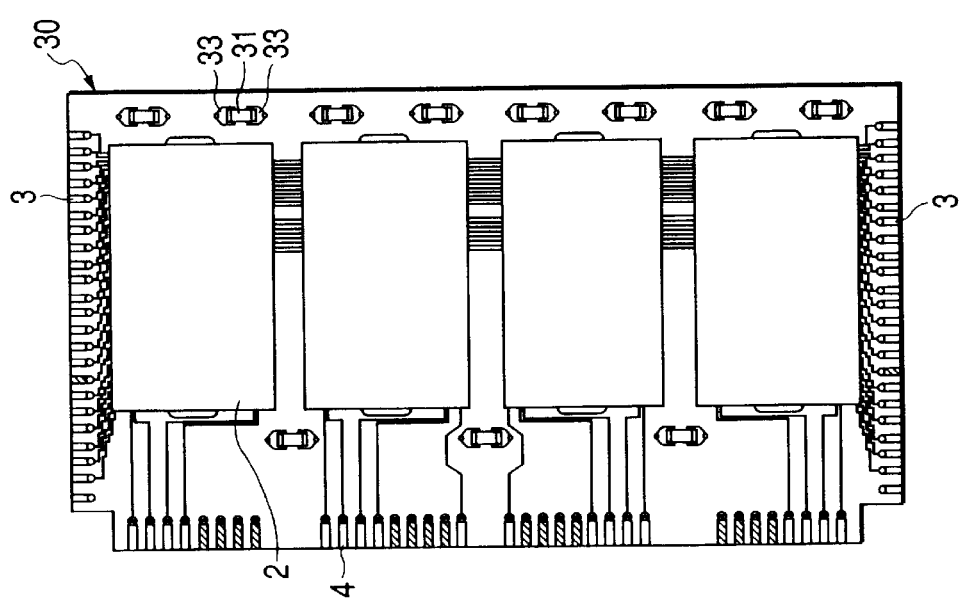

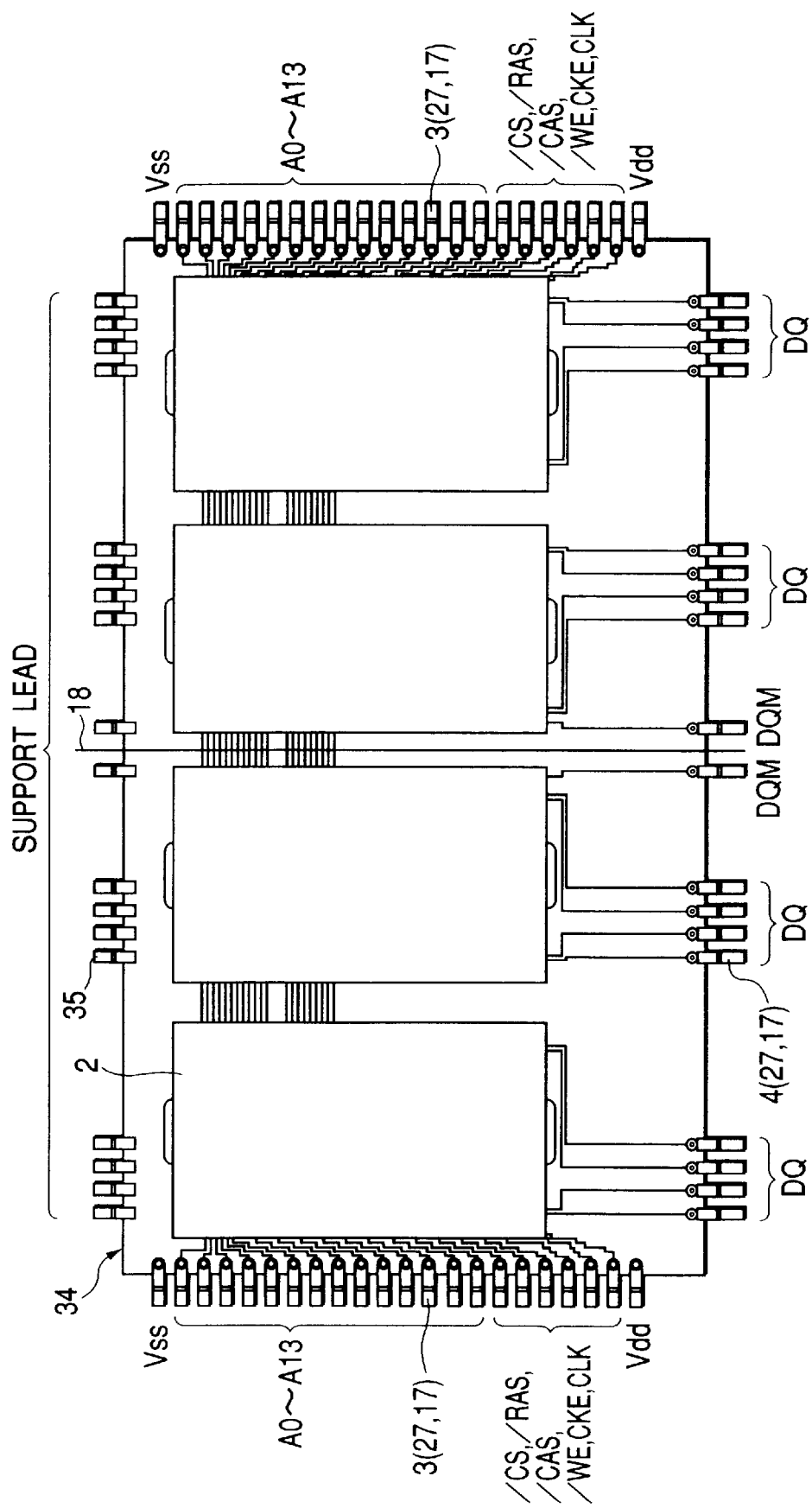

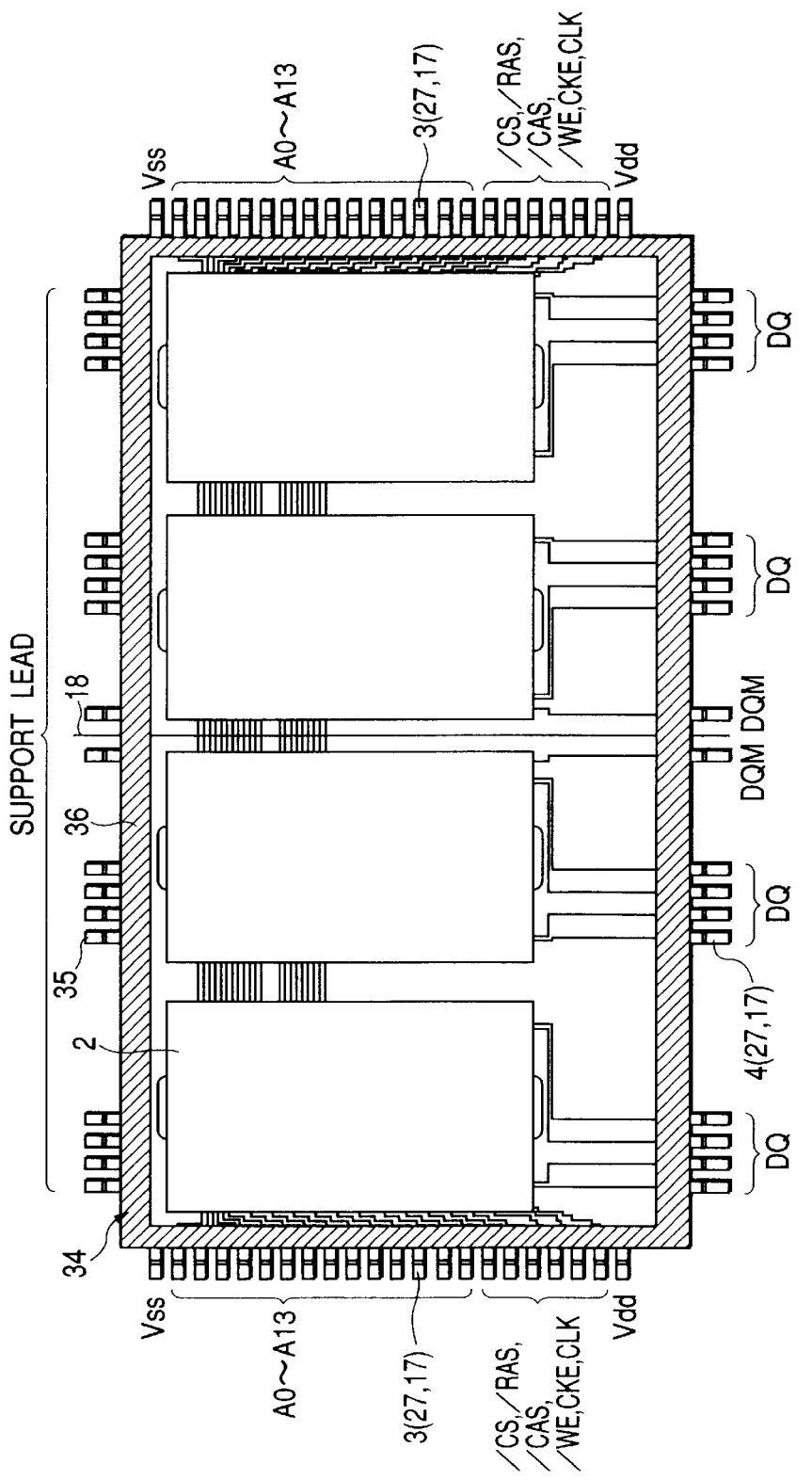

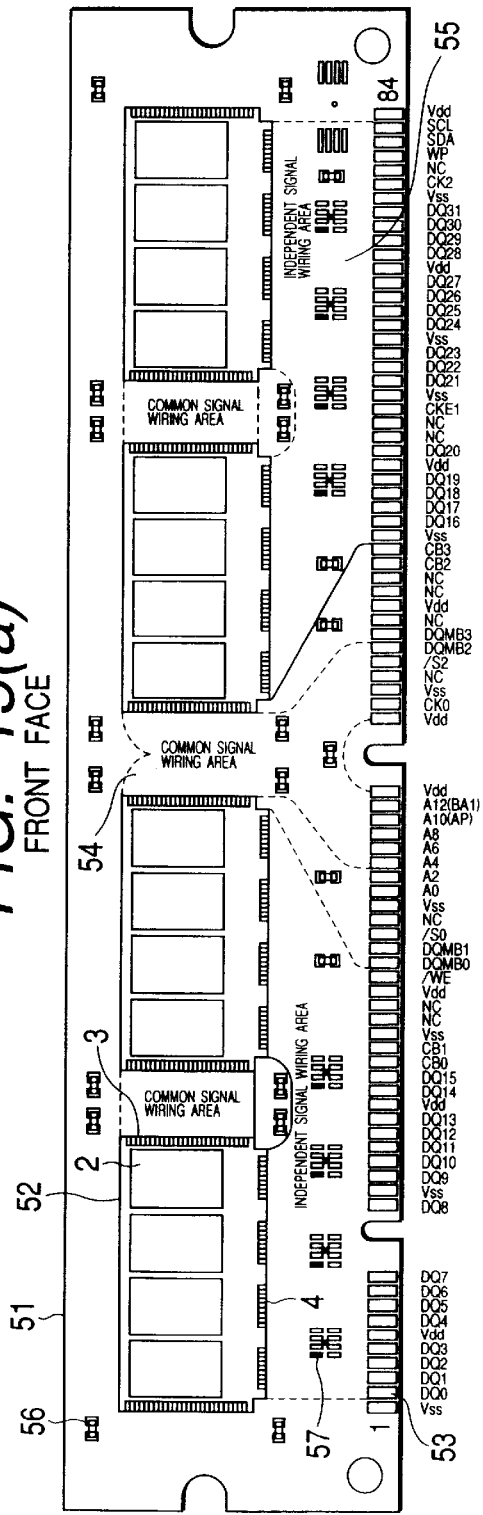
FIG. 15(a) FRONT FACE
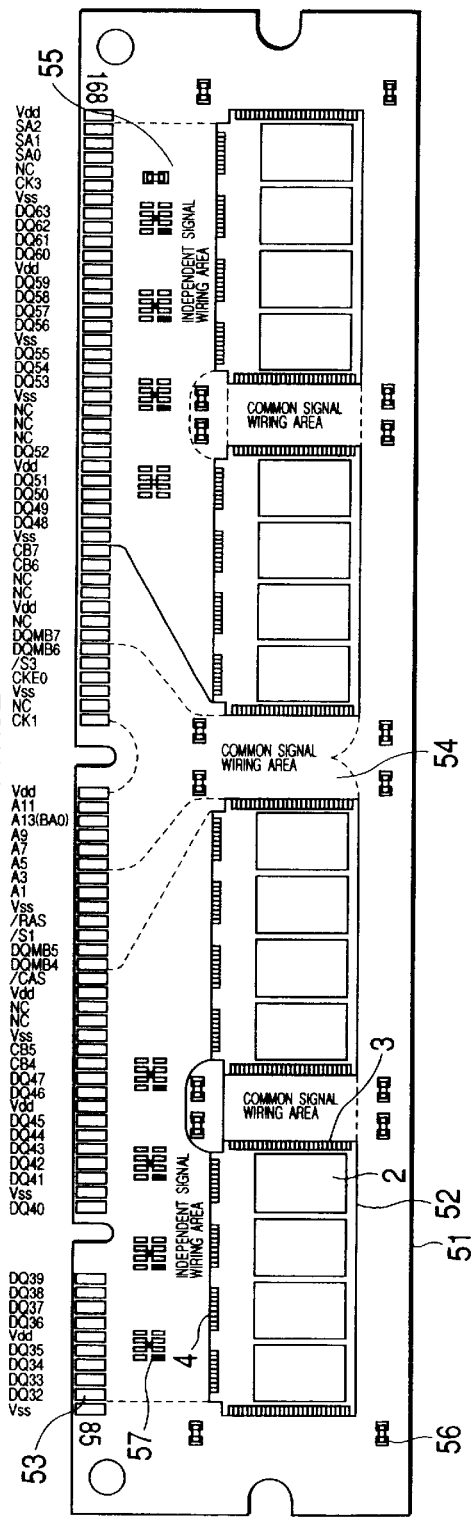
FIG. 15(b) REAR FACE

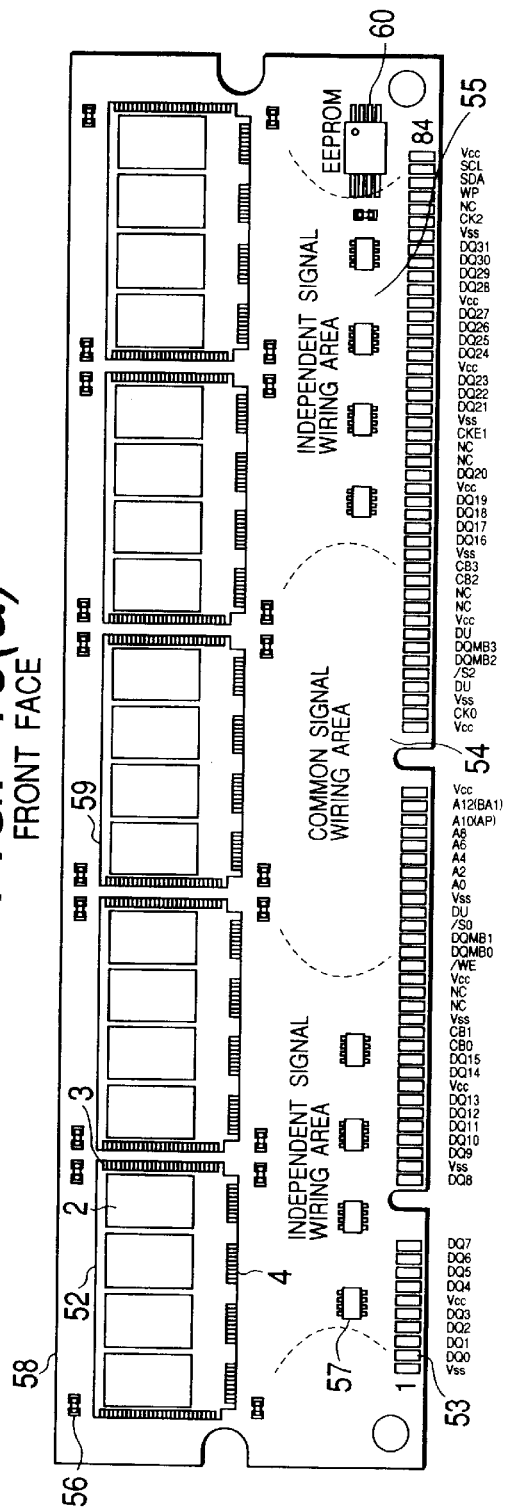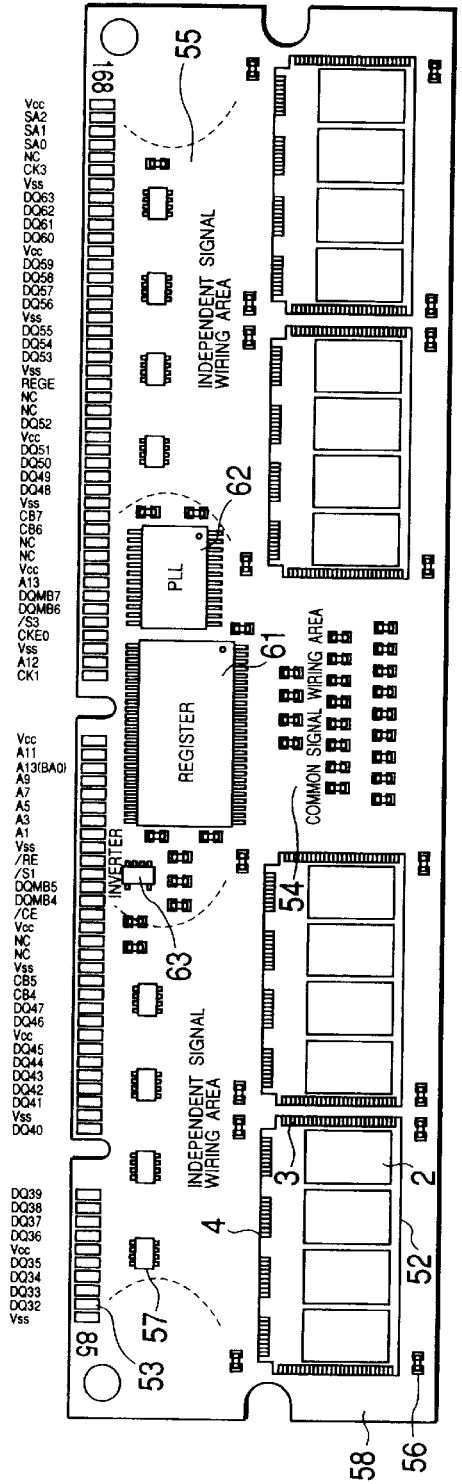

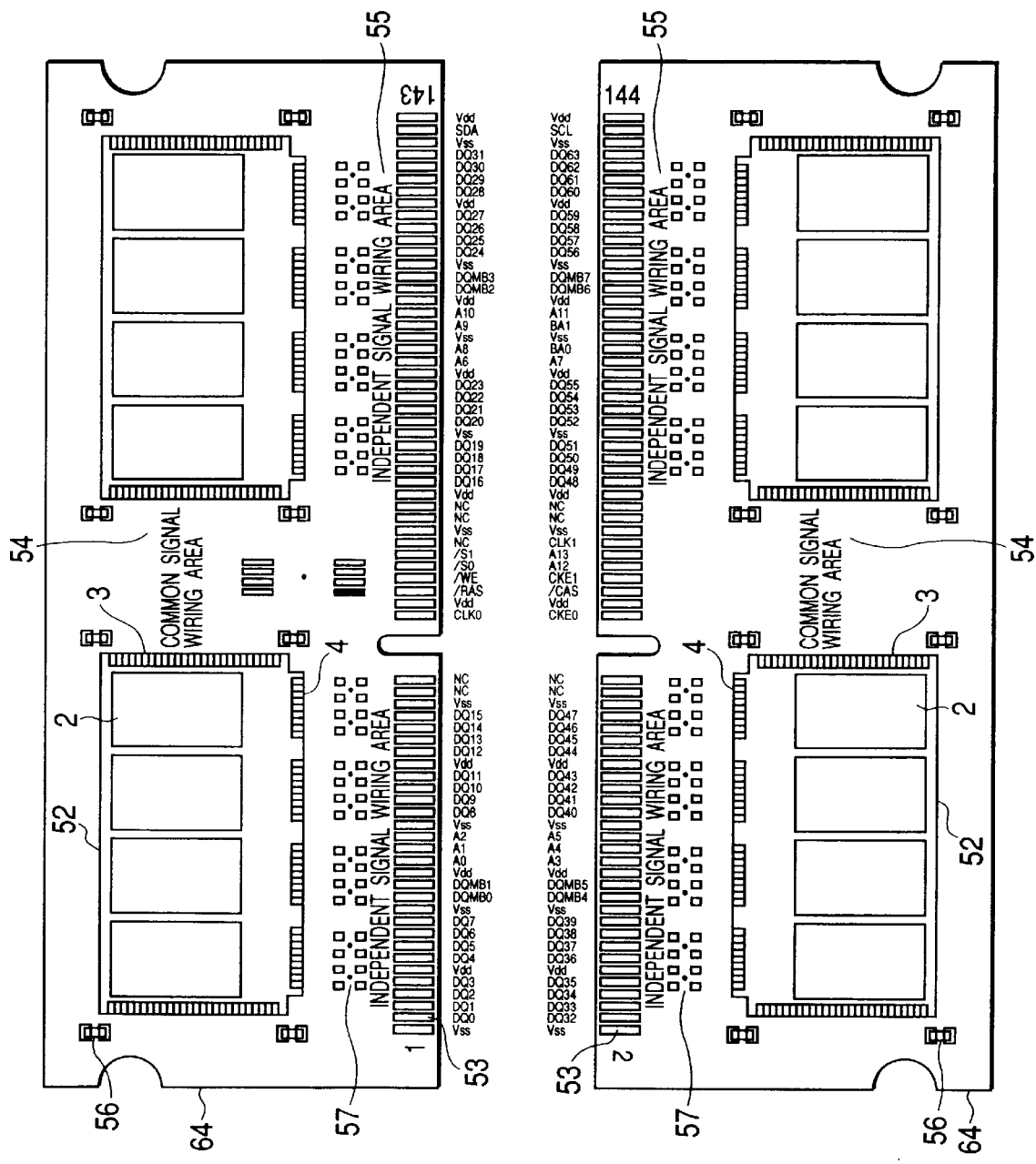
FIG. 17(a) FRONT FACE
FIG. 17(b) REAR FACE

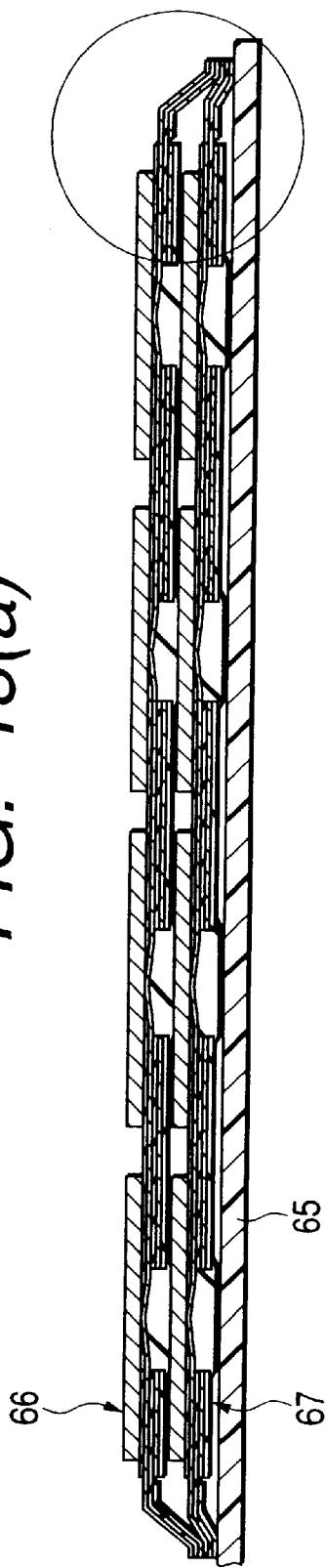
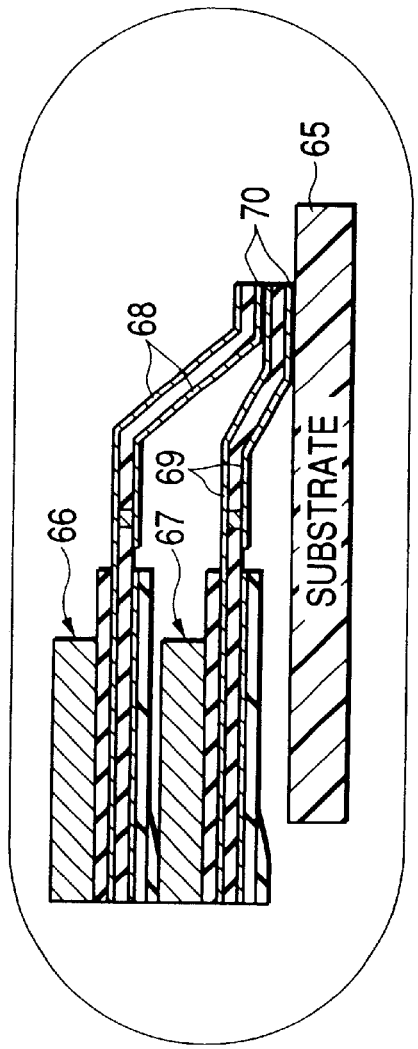
FIG. 18(a)
FIG. 18(b)

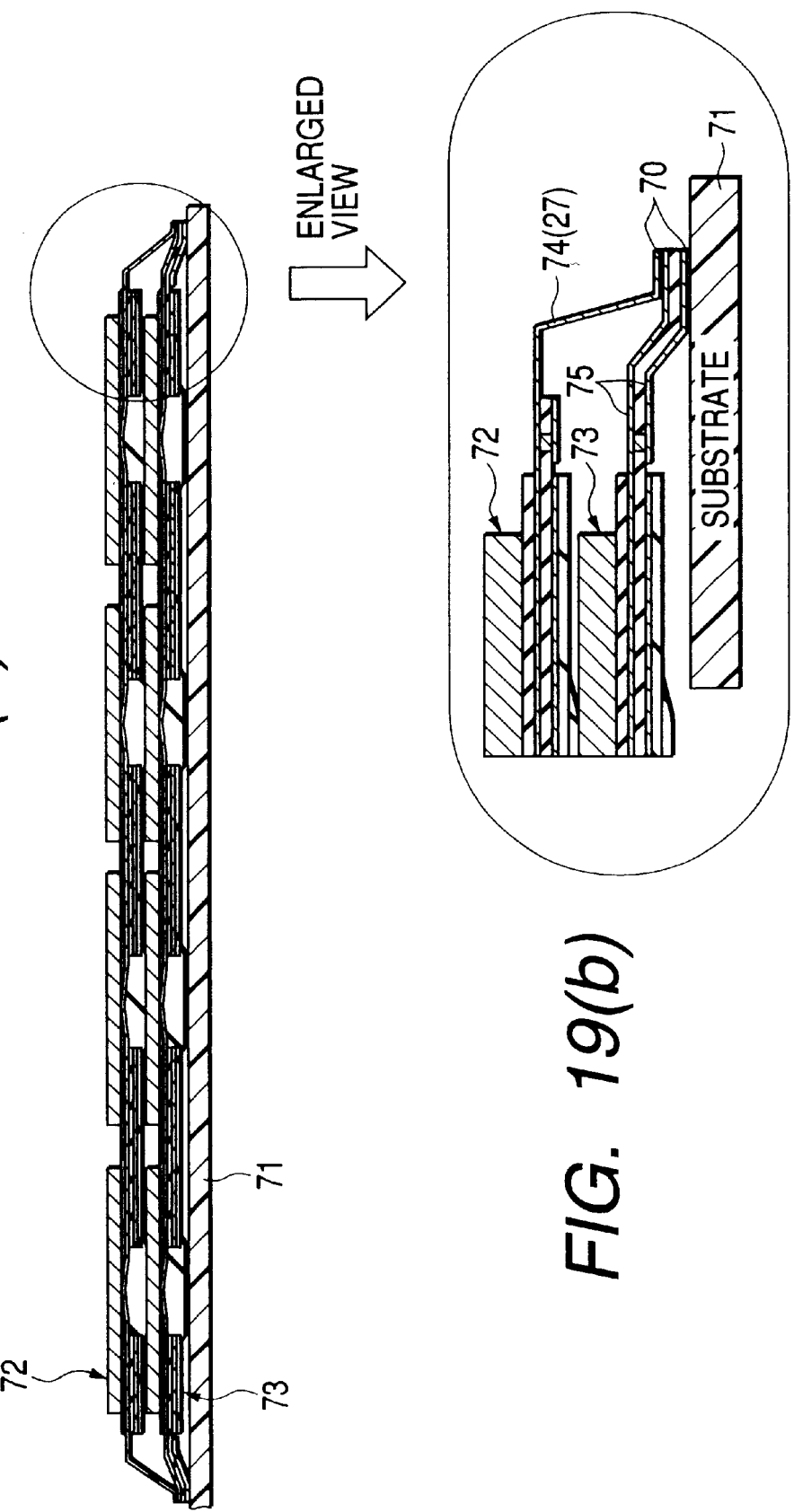

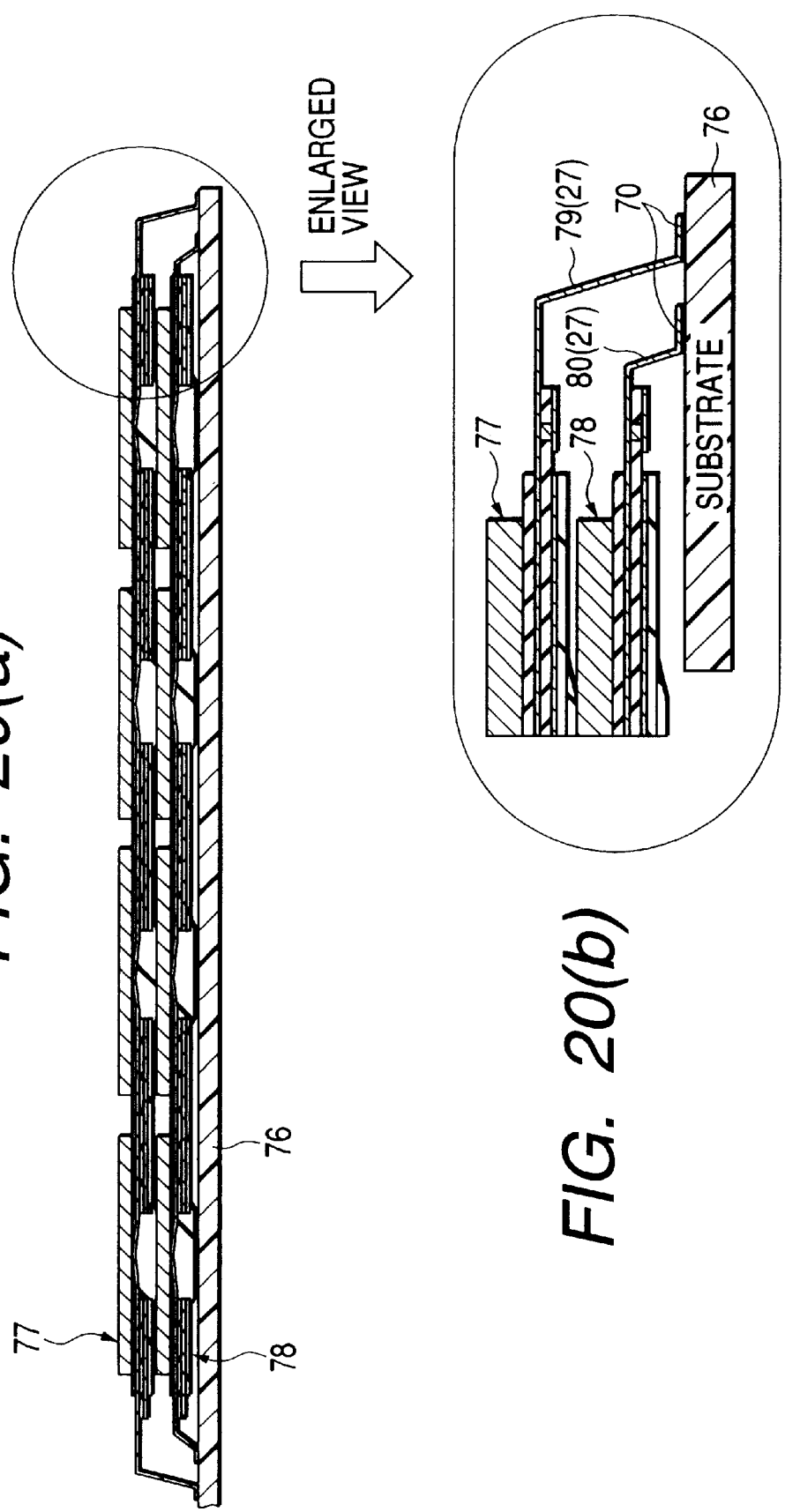

US 6,756,661 B2

SEMICONDUCTOR DEVICE, A SEMICONDUCTOR MODULE LOADED WITH SAID SEMICONDUCTOR DEVICE AND A METHOD OF MANUFACTURING SAID SEMICONDUCTOR DEVICE

FIELD OF THE INVENTION

The present invention relates to a semiconductor device, a semiconductor module loaded with the semiconductor device, and a manufacturing technique of the semiconductor module, and particularly relates to a tape carrier type semiconductor device (TCP: Tape Carrier Package) for mounting plural chips to one tape, and an effective technique applied to a semiconductor module loaded with plural TCPs.

BACKGROUND OF THE INVENTION

For example, when a memory TCP such as a DRAM is made as a conventional manufacturing technique of the tape carrier package, there is a one-chip built-in TCP package in which a series of insulating tapes forming lead wiring therein is used, and an individual memory chip is sequentially mounted to these insulating tapes, and the memory chip and the lead wiring are finally set to a pair.

In manufacture of this memory TCP, for example, in a selecting process, a material processed in a tape shape so far is conveyed in a state in which this material is cut into an individual piece. For example, it is indispensable in this individual tape piece described in Japanese Patent Laid-Open No. 37141/1994 that a pad for a test probe is arranged around an outer lead. An outer shape size of the individual tape piece is four times or more in area in comparison with a TSOP (Thin Small Outline Package), etc. Accordingly, a socket for burn-in and a test is also four times or more in area in comparison with the TSOP. Further, when the test is terminated, the individual tape piece is cut in an outer lead portion in a final process, and the outer lead is formed in a gull-wing shape, and is stored to a tray.

Further, for example, when this memory TCP is produced as a memory module, the memory TCP is again picked up one by one from the tray, and plural memory TCPs are mounted onto a substrate and are completed as a memory module of a predetermined capacity in a module mounting process.

SUMMARY OF THE INVENTION

With respect to the technique of the memory TCP mentioned above and the memory module loaded with this memory TCP, the following contents have become clear as a result of consideration of the prevent inventors. For example, in manufacture of the memory TCP, the individual tape piece for burn-in and a test is large in size so that a socket size mountable in comparison with the TSOP is increased. Therefore, the number of sockets attached to a board for burn-in and a test is greatly reduced. As a result, a processing number is reduced, in other words, cost is increased.

Further, the material is conveyed in a tape state until a seal process in a TAB (Tape Automated Bonding) process itself. However, after the selecting process, the material is individually cut, and is again mounted to the memory module one by one in the memory module mounting process. This is disadvantageous in view of mounting cost and mounting area. Accordingly, it is considered that an efficient process at low cost is realized if the tape is supplied to the memory module process as it is, and the tape can be simultaneously cut and mounted to the substrate.

As an example of the memory module, for example, there is a memory module described in Japanese Patent Laid-Open No. 350961/1992. In this memory module, lead wiring of the tape is set to multiple layers, and plural chips mounted through an insulating film are electrically connected to each other. In this technique, the lead wiring of the tape and a chip are connected to each other by wire bonding, and it is necessary to draw lead wiring for a common signal common to chips around one side of the module so that a wiring layer is required every common signal. Accordingly, the number of layers in a tape structure is extremely large. Therefore, it is considered that it is difficult to design the tape and it is disadvantageous in cost.

Therefore, an object of the invention is to provide a semiconductor device able to reduce tape cost and burn-in and test cost by simplifying a tape design and increasing a simultaneous processing number in burn-in and test using an assembly process of a TCP, and further provide a semiconductor module able to reduce substrate cost and module mounting cost by mounting plural semiconductor devices and simplifying a substrate design and efficiently performing module mounting.

The above and other objects and novel features of the invention will become apparent from the description and the accompanying drawings of the present specification.

Summaries of typical inventions among the inventions disclosed in the present application will be explained briefly as follows.

Namely, a first semiconductor device in the invention as the structure of a basic multi-chip TCP is a tape carrier type semiconductor device for mounting plural chips to one tape in which common signal terminals are arranged on one set of two opposed sides, and an independent signal terminal is arranged on another side, and the common signal terminals on the two sides are electrically connected to each other by common signal wiring.

A second semiconductor device in the invention as the structure of a multi-chip TCP able to be divided into two portions is a tape carrier type semiconductor device for mounting plural chips to one tape in which common signal terminals are arranged on one set of two opposed sides, and an independent signal terminal is arranged on another side, and the common signal terminals arranged on the one set of two opposed sides are arranged with left-right mirror symmetry. Further, two mirror symmetry tape carrier type semiconductor devices are formed by cutting the tape at its center.

Further, a third semiconductor device in the invention as the structure of a multi-chip TCP of a lead type is a tape carrier type semiconductor device for mounting plural chips to one tape in which common signal terminals are arranged on one set of two opposed sides, and an independent signal terminal is arranged on another side, and a lead continuously extends to the common signal terminals and the independent signal terminal and is projected from the tape, and the common signal terminals on the two sides are electrically connected to each other by common signal wiring. Further, plural support leads electrically unconnected to the mounted chip are arranged on another side opposed to the lead of the independent signal terminal.

Further, a fourth semiconductor device in the invention as the structure of a multi-chip TCP able to be laminated is a tape carrier type semiconductor device for mounting plural chips to one tape in which a semiconductor device having common signal terminals arranged on one set of two opposed sides, a first independent signal terminal arranged on another side, and a second independent signal terminal electrically unconnected to the chips mounted to the tape is laminated, and the first independent signal terminal at an upper stage and the second independent signal terminal at a lower stage are connected to each other, and the second independent signal terminal at the upper stage and the first independent signal terminal at the lower stage are connected to each other. Further, the laminated semiconductor device is laminated by a tape-on-tape structure, a lead-on-tape structure or a lead-on-lead structure.

In the structure of each of the first, second, third and fourth semiconductor devices, pads of the chip are set such that a pad connected to the common signal wiring is arranged far from the independent signal terminal, and a pad connected to independent signal wiring is arranged near the independent signal terminal. Further, the common signal wiring and the independent signal wiring formed on the tape are located on the same face, and do not cross each other.

The tape is a one-layer tape or a two-layer tape. A ground electric potential plane pattern and a power electric potential plane pattern are mainly formed on a face opposed to a forming face of the common signal wiring and the independent signal wiring in the two-layer tape. Further, an insulating material is interposed between a main face of the chip and signal wiring of the two-layer tape.

Chip parts are mounted to the tape. A frame is also arranged on one face of the tape so as to surround the chip. The frame is constructed by plastic or a metal having a good heat radiating property. A metallic plate is fixedly attached to the chip.

A recognizing mark pattern is formed in the tape. Further, an index for pin display is formed in the tape.

The independent signal terminal and another independent signal terminal electrically unconnected to the chip mounted to the tape are arranged on the another side.

A first semiconductor module in the invention is a semiconductor module mounting the plural first semiconductor devices thereto in which plural external terminals are formed on one long side of a rectangular substrate, and the independent signal terminal is arranged along an arranging direction of the external terminals. Further, the first semiconductor device loaded with four chips and the second semiconductor device loaded with two chips are mixed with each other.

A second semiconductor module in the invention is a semiconductor module mounting the plural third semiconductor devices thereto in which plural external terminals are formed on one long side of a rectangular substrate, and the independent signal terminal is arranged along an arranging direction of the external terminals. Further, the first semiconductor device loaded with four chips and the second semiconductor device loaded with two chips are mixed with each other.

Further, a third semiconductor module in the invention is a semiconductor module mounting the plural fourth semiconductor devices thereto in which plural external terminals are formed on one long side of a rectangular substrate, and the independent signal terminal is arranged along an arranging direction of the external terminals. Further, the plural semiconductor devices are laminated by the tape-on-tape structure, the lead-on-tape structure, the lead-on-lead structure or a lead-on-board structure. In the lead-on-board structure, the lead of the semiconductor device at the lower stage lies across the lead of the semiconductor device at the upper stage, and the lead of the semiconductor device at the upper stage is longer. Further, the first semiconductor device loaded with four chips and the second semiconductor device loaded with two chips are mixed with each other.

In the structures of the first, second and third semiconductor modules, a resin seal type semiconductor device is mounted between the external terminals and the plural semiconductor devices. Further, a mounting face of the substrate and a chip main face are mounted such that these faces are facing each other.

In a manufacturing method of the semiconductor module in the invention, a tape carrier type semiconductor device loaded with plural chips is completed by cutting a series of tapes forming common signal terminals therein every plural chips approximately along a central line so as to divide these common signal terminals into two portions in a tape cut process of an assembly process of the tape carrier type semiconductor device. Further, the tape carrier type semiconductor device loaded with the plural chips is divided into two portions in a portion in which there are no common signal terminals. When the tape carrier type semiconductor device loaded with the plural chips is completed, the tapes are cut every four chips, and are cut in a unit of two chips in a portion in which there are no common signal terminals.

Accordingly, in accordance with the invention, it is possible to manufacture a first semiconductor device as the structure of a basic multi-chip TCP, a second semiconductor device as the structure of a multi-chip TCP able to be divided into two portions, a third semiconductor device as the structure of a multi-chip TCP of a lead type, and a fourth semiconductor device as the structure of a multi-chip TCP able to be laminated. Further, it is possible to manufacture a first semiconductor module loaded with the first semiconductor device (mixed with the second semiconductor device), a second semiconductor module loaded with the third semiconductor device (mixed with the first and second semiconductor devices), and a third semiconductor module loaded with the fourth semiconductor device (mixed with the first and second semiconductor devices) by combining the first to fourth semiconductor devices.

BRIEF DESCRIPTION OF THE DRAWINGS

FIG. 2 is a plan view showing the semiconductor device of this embodiment mode.

FIGS. 3A and 3B are respectively a cross-sectional view and a partially enlarged sectional view showing the semiconductor device of this embodiment mode.

FIGS. 8A and 8B are respectively a plan view and a cross-sectional view showing the memory TCP when the memory TCP has a lead projected from the tape as a modified example of this embodiment mode.

FIGS. 9A, 9B and 9C are respectively a plan view, a cross-sectional view and a plan view showing the memory TCP when a one-layer taper is used as a modified example of this embodiment mode.

FIGS. 10A and 10B are respectively a plan view and a rear view showing the memory TCP of a structure in which a capacitor is mounted onto a chip mounting face of the tape as a modified example of this embodiment mode.

FIG. 11 is a plan view showing the memory TCP of a structure having a support lead in the tape as a modified example of this embodiment mode.

FIGS. 12A and 12B are respectively a plan view and a cross-sectional view showing the memory TCP of a structure having a frame in a tape 34 as a modified example of this embodiment mode.

FIGS. 15A and 15B are respectively a plan view and a rear view showing a semiconductor module loaded with the semiconductor device of this embodiment mode.

FIGS. 16A and 16B are respectively a plan view and a rear view showing a memory module of a registered DIMM as a modified example of this embodiment mode.

FIGS. 17A and 17B are respectively a plan view and a rear view showing a memory module of a SODIMM as a modified example of this embodiment mode.

FIGS. 18A, 18B and 18C are respectively a cross-sectional view and a partially enlarged sectional view showing a memory module laminated and mounted by a tape-on-tape structure, and a plan view showing the memory TCP at an upper stage as a modified example of this embodiment mode.

FIGS. 19A and 19B are respectively a cross-sectional view and a partially enlarged sectional view showing a memory module laminated and mounted by a lead-on-tape structure as a modified example of this embodiment mode.

FIGS. 20A and 20B are respectively a cross-sectional view and a partially enlarged sectional view showing a memory module laminated and mounted by a lead-on-board structure as a modified example of this embodiment mode.

DESCRIPTION OF THE PREFERRED EMBODIMENTS

Figure 1:
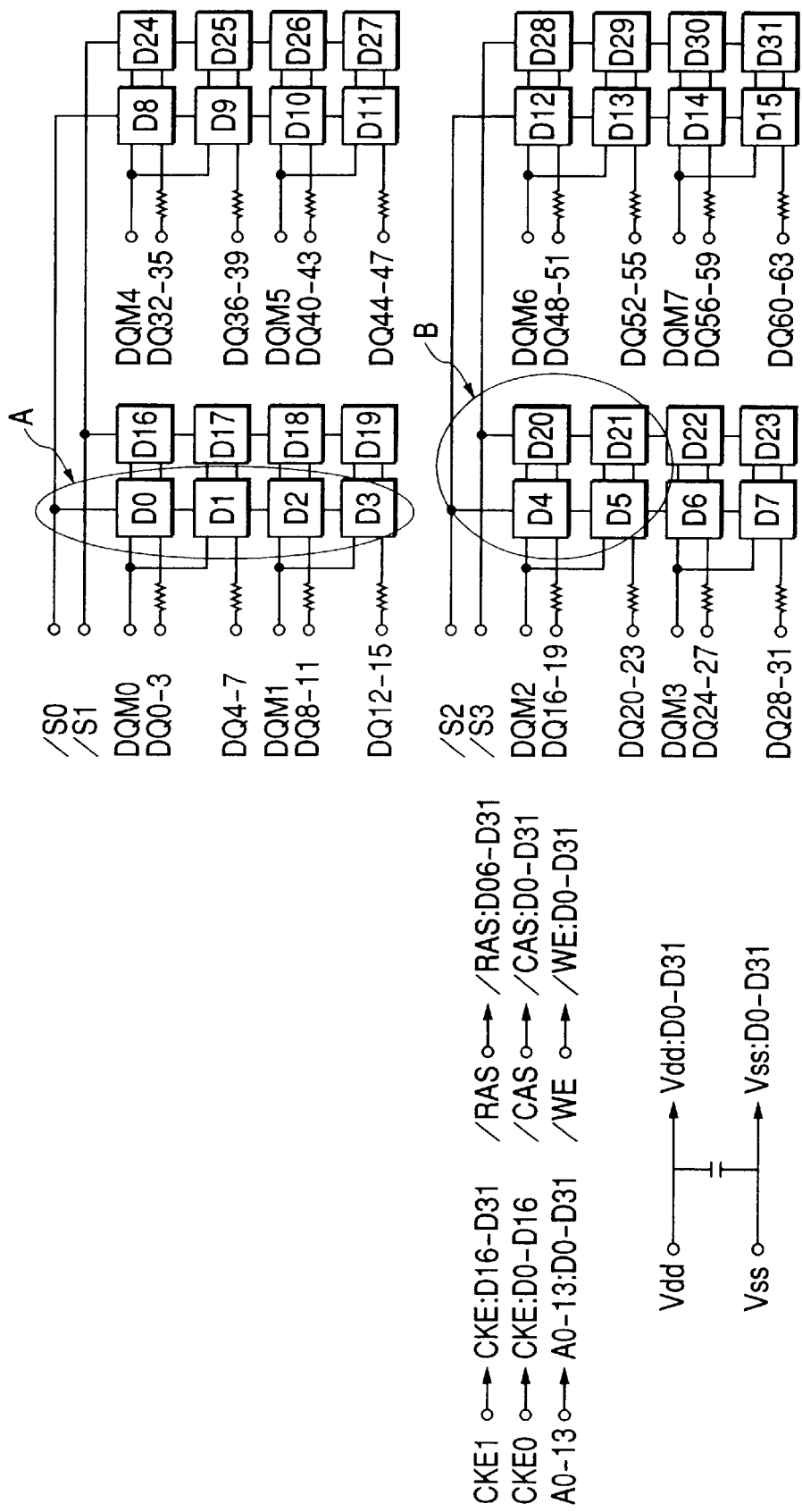
FIG. 1 is a block diagram showing the relation of a semiconductor device in one embodiment mode of the invention and a semiconductor module loaded with this semiconductor device.

Embodiments modes of the present invention will next be explained in detail on the basis of the drawings. In all figures for explaining the embodiment modes, the same reference numerals are designated to the same members, and their repetitious explanations are omitted.

Figure 4A:
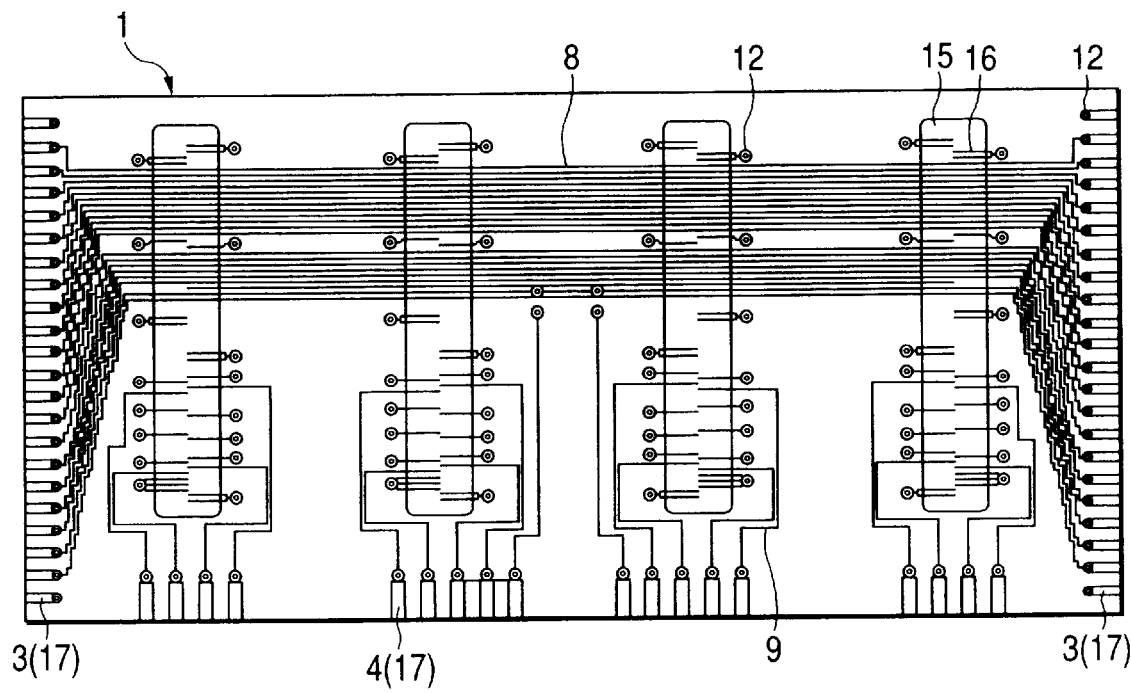
FIGS. 4A and 4B are views of front and rear face patterns showing a two-layer tape in this embodiment mode.
Figure 4B:
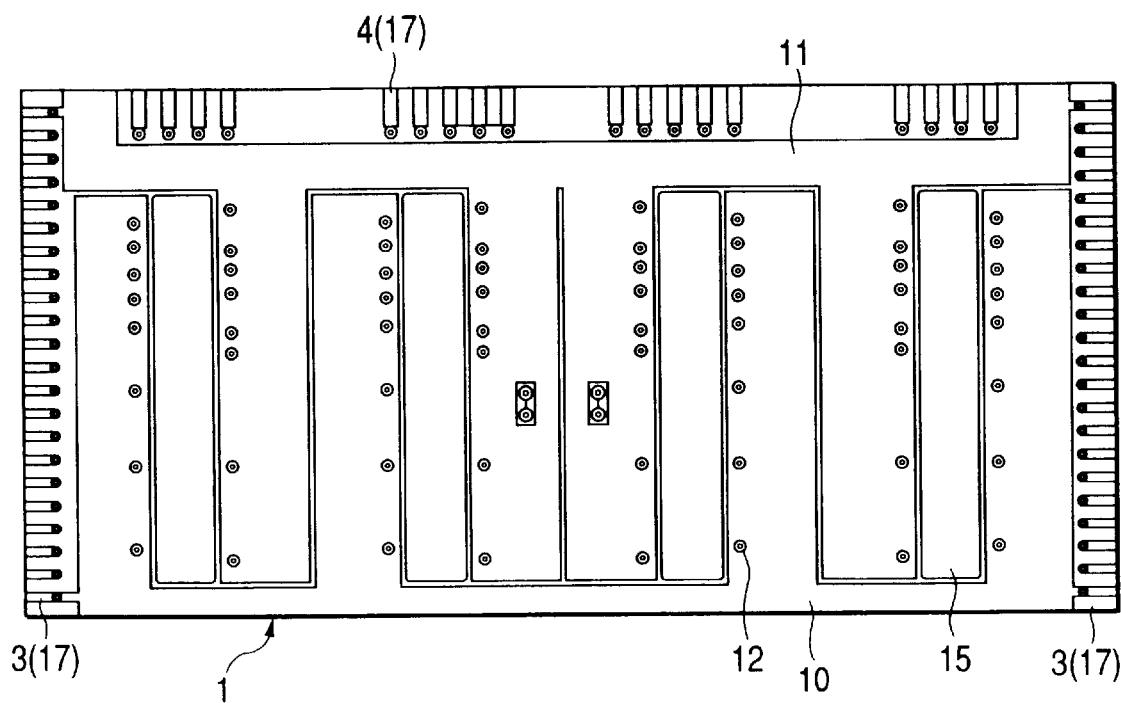
Figure 5:
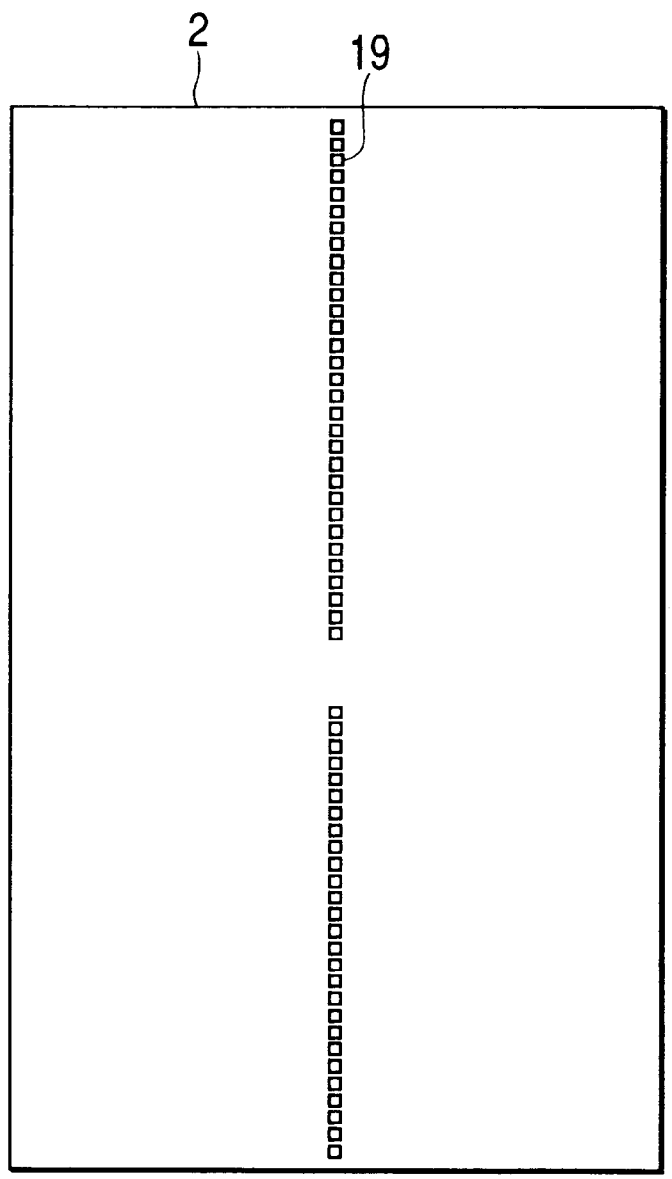
FIG. 5 is a plan view showing a main face of a chip in this embodiment mode.
Figure 25:
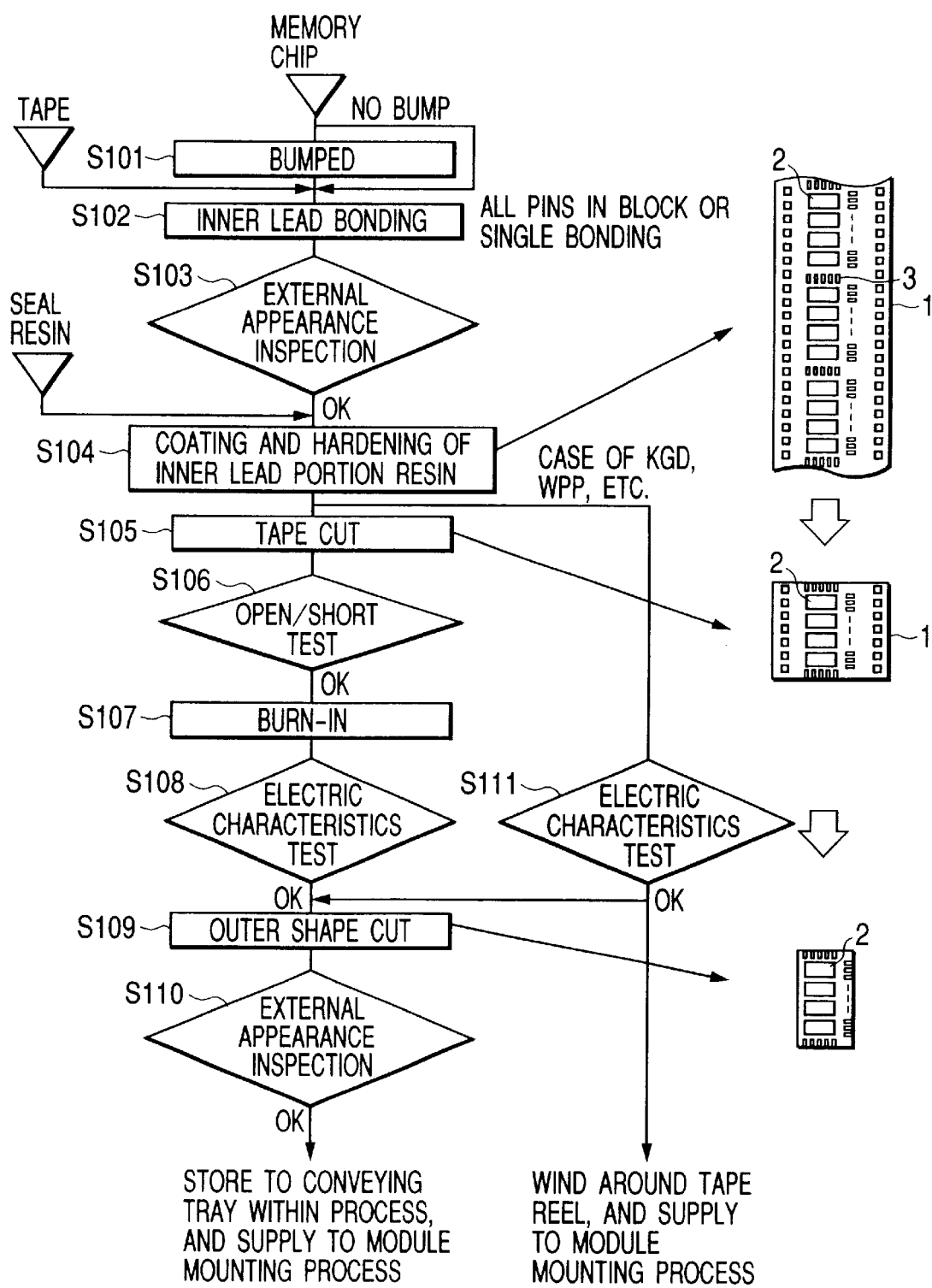
FIG. 25 is a flow diagram showing a manufacturing process of the semiconductor device of this embodiment mode.
Figure 26:
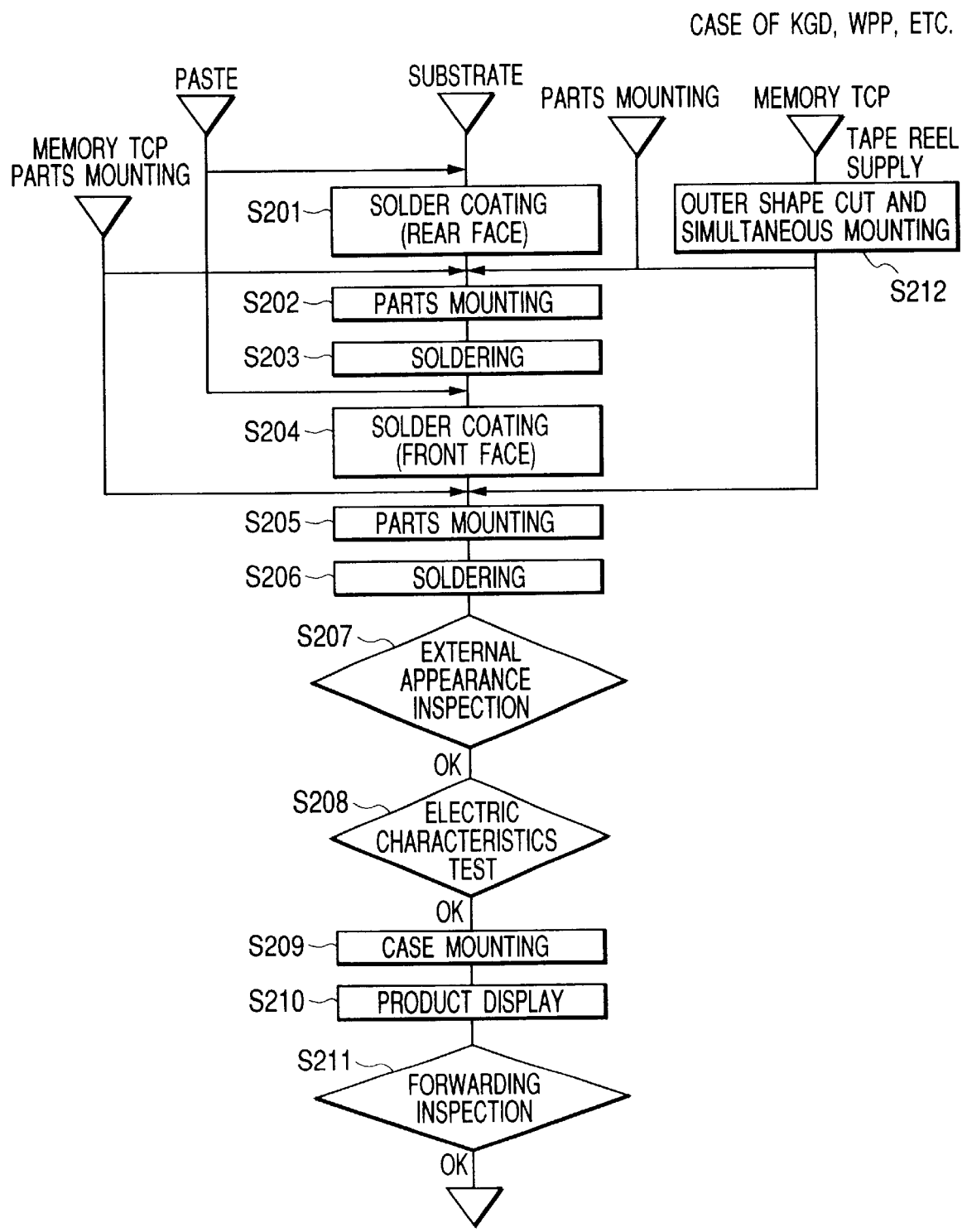
FIG. 26 is a flow diagram showing a manufacturing process of the semiconductor module loaded with the semiconductor device of this embodiment mode.

FIG. 1 is a block diagram showing the relation of a semiconductor device in one embodiment mode of the invention and a semiconductor module loaded with this semiconductor device. FIGS. 2 and 3 are respectively plan and sectional views showing the semiconductor device of this embodiment mode. FIG. 4 is a view of front and rear face patterns showing a two-layer tape. FIG. 5 is a plan view showing a main face of a chip. FIGS. 6 to 14 are explanatory views showing modified examples of the semiconductor device. FIG. 15 is a plan view and a rear view showing the semiconductor module loaded with the semiconductor device of this embodiment mode. FIGS. 16 to 24 are explanatory views showing modified examples of the semiconductor module. FIGS. 25 and 26 are flow diagrams showing manufacturing processes of the semiconductor device and the semiconductor module loaded with the semiconductor device.

First, one example of the relation of the semiconductor device of this embodiment mode and the semiconductor module loaded with this semiconductor device will be explained by FIG. 1. For example, the semiconductor module shown in FIG. 1 is an unbuffered DIMM (Dual In-line Memory Module) of 64-bit 2-bank, and can be constructed by a collection of four chips such as A and B, i.e., A: 1-bank 16-bit type and B: 2-bank 8-bit type. Similarly, the semiconductor module can be also constructed by a 1-bank 8-bit type and a 2-bank 4-bit type in a collection of two chips, or a 1-bank 32-bit type and a 2-bank 16-bit type in a collection of eight chips. A collection portion of these chips constituting the semiconductor module in FIG. 1 can be formed as one semiconductor module. In the following description, features of the 1-bank 16-bit type of a multi-chip module of four chips will be mainly explained as an example.

In FIG. 1, each of reference numerals D0 to D31 designates a chip. A clock enable signal CKE1 is supplied to chips D16 to D31 as CKE. A clock enable signal CKE0 is supplied to chips D0 to D16 as CKE. Address signals A0 to A13 are supplied to chips D0 to D31. A low address strobe signal /RAS is supplied to chips D6 to D31. A column address strobe signal /CAS is supplied to chips D0 to D31. A write enable signal /WE is supplied to chips D0 to D31. A power electric potential Vdd is supplied to chips D0 to D31. A ground electric potential Vss is supplied to chips D0 to D31. Further, a chip select signal /S0 is supplied to chips D0 to D3, and D8 to D11. A chip select signal /S1 is supplied to chips D16 to D19, and D24 to D27. A chip select signal /S2 is supplied to chips D4 to D7, and D12 to D15. A chip select signal /S3 is supplied to chips D20 to D23, and D28 to D31.

Further, input-output data DQ0 to DQ3 are set to input-output data of chips D0 and D16. Input-output data DQ4 to DQ7 are set to input-output data of chips D1 and D17. Input-output data DQ8 to DQ11 are set to input-output data of chips D2 and D18. Input-output data DQ12 to DQ15 are set to input-output data of chips D3 and D19. Input-output data DQ16 to DQ19 are set to input-output data of chips D4 and D20. Input-output data DQ20 to DQ23 are set to input-output data of chips D5 and D21. Input-output data DQ24 to DQ27 are set to input-output data of chips D6 and D22. Input-output data DQ28 to DQ31 are set to input-output data of chips D7 and D23. Input-output data DQ32 to DQ35 are set to input-output data of chips D8 and D24. Input-output data DQ36 to DQ39 are set to input-output data of chips D9 and D25. Input-output data DQ40 to DQ43 are set to input-output data of chips D10 and D26. Input-output data DQ44 to DQ47 are set to input-output data of chips D11 and D27. Input-output data DQ48 to DQ51 are set to input-output data of chips D12 and D28. Input-output data DQ52 to DQ55 are set to input-output data of chips D13 and D29. Input-output data DQ56 to DQ59 are set to input-output data of chips D14 and D30. Input-output data DQ60 to DQ63 are set to input-output data of chips D15 and D31.

Further, a data mask signal DQM0 is set to a signal of chips D0, D1, D16 and D17. A data mask signal DQM1 is set to a signal of chips D2, D3, D18 and D19. A data mask signal DQM2 is set to a signal of chips D4, D5, D20 and D21. A data mask signal DQM3 is set to a signal of chips D6, D7, D22 and D23. A data mask signal DQM4 is set to a signal of chips D8, D9, D24 and D25. A data mask signal DQM5 is set to a signal of chips D10, D11, D26 and D27. A data mask signal DQM6 is set to a signal of chips D12, D13, D28 and D29. A data mask signal DQM7 is set to a signal of chips D14, D15, D30 and D31.

One example of the construction of the semiconductor device of this embodiment mode will next be explained by FIG. 2 (a plan view) and FIG. 3 (a cross-sectional view taken along line X–X' of FIG. 2). The semiconductor device of this embodiment mode is constructed by a memory TCP of four chips (1-bank 16-bit type) shown in FIG. 1 and loaded with plural chips in one tape. This memory TCP is constructed by a tape 1 of one two-layer wiring layer structure, four chips 2 mounted to this tape 1, etc. Common signal terminals 3 are arranged on one set of two opposed sides of the tape. An independent signal terminal 4 is arranged on another side of the tape. The common signal terminals 3 on the two sides are electrically connected to each other by common signal wiring.

For example, the tape 1 is constructed by a two-layer tape in which wiring patterns 6 and 7 are formed on front and rear faces of an insulating basic material 5. For example, as shown in FIG. 4 (FIG. 4A shows the front face and FIG. 4B shows the rear face), the wiring patterns of the common signal wiring 8 and independent signal wiring 9 are formed on the front face of the insulating basic material 5 without crossing these wiring patterns on the same face. A ground electric potential plane pattern 10 and a power electric potential plane pattern 11 are formed on the rear face of the insulating basic material 5. The wiring patterns on the front face and the plane patterns on the rear face requiring electric conduction, and the front and rear faces of the common signal terminal 3 and the independent signal terminal 4 are connected to each other by through holes (via hole & land) 12. For example, this tape 1 is constructed by a tape member in which the insulating basic material 5 is formed by polyimide resin, etc. as one example. Wiring patterns 6, 7 are constructed by a metallic thin film such as a copper foil. The wiring patterns on the front and rear faces are coated with insulating coat materials 13, 14 such as polyimide resin to prevent a short circuit on a chip main face, or protect the wiring patterns from an external environment.

This tape 1 is approximately formed in a rectangular plane shape. The common signal terminals 3 are arranged on the front and rear faces on two opposed short sides of this tape 1 (both sides in FIG. 2). The independent signal terminals 4 are arranged on the front and rear faces on one long side (downward in FIG. 2) of the tape 1. The common signal terminals 3 on the two sides are commonly connected to each other across each chip 2 on the front face by each common signal wiring 8 extending in a long side direction. The independent signal terminals 4 on the one side are independently connected by each independent signal wiring 9 every chip 2. Four opening portions 15 are formed in this tape 1 in accordance with a mounting position of each chip 2. Each chip 2 and an inner lead 16 of the tape 1 are connected to each other through each opening portion 15. For example, a copper foil is plated with gold in a portion of this inner lead 16 as one example. The common signal terminal 3 and the independent signal terminal 4 become an outer lead 17.

There are a terminal for inputting the address signals A0 to A13, the chip select signal /CS, the low address strobe signal /RAS, the column address strobe signal /CAS, the write enable signal /WE, the clock enable signal CKE, the clock signal CLK, etc., and a terminal for supplying the ground electric potential Vss, the power electric potential Vdd, etc. as the common signal terminal 3. There is a terminal for inputting and outputting the input-output data DQ, the data mask signal DQM, etc. as the independent signal terminal 4.

In this tape 1, the common signal terminal 3 and the independent signal terminal 4 are arranged with left-right mirror symmetry with respect to a cut line 18 to the long side. Namely, the common signal terminals 3 are arranged in parallel with each other at the same interval on the two opposed short sides, and the independent signal terminals 4 are arranged at the same interval on the left-hand and right-hand sides of a long side. Thus, two memory TCPs loaded with chips 2 two by two can be manufactured by cutting the tape 1 along the cut line 18.

For example, each chip 2 is constructed by a memory chip such as a DRAM, and a memory circuit is formed within the chip. For example, as shown in FIG. 5, a pad 19 for drawing-out an electrode of this memory circuit to the exterior is arranged in a line on a main face in a central portion along the long side direction so that a so-called center pad structure is formed. In the pad 19 arranged in a line in each chip 2, a pad for a common signal connected to the common signal wiring 8 of the tape 1 is arranged far from the independent signal terminal 4, and a pad for an independent signal connected to the independent signal wiring 9 is arranged near the independent signal terminal 4.

In the memory TCP constructed above, in electric connection of the tape 1 and each chip 2, the chip 2 is mounted such that the main face of the chip 2 is arranged on a wiring layer side of the inner lead 16 of the tape 1. The pad 19 of each chip 2 and the inner lead 16 corresponding to each chip 2 of each common signal wiring 8 extending in the long side direction on the tape 1 are connected to each other. Thus, the electric connection is made from each chip 2 to the common signal terminals 3 on two sides. Further, the pad 19 of each chip 2 and the inner lead 16 corresponding to each chip 2 of each independent signal wiring 4 on the tape 1 are connected to each other. Thus, the electric connection is made from each chip 2 to the independent signal terminal 4 on one side. After this tape 1 and each chip 2 are connected to each other, an electrically exposed portion such as a connection portion of the pad 19 on the chip 2 and the inner lead 16 on the tape 1 is potted and sealed by seal resin 20 such as epoxy resin as one example.

In the memory TCP mentioned above, as explained later with reference to FIG. 25, a series of tapes wound around a tape reel, etc. and having the common signal terminal 3 formed every four chips is cut in a tape cut process of an assembly process of the TCP such that the common signal terminals 3 are divided into two Portions. Thus, it is possible to manufacture the memory TCP loaded with four chips in which the tape 1 is loaded with four chips 2. Further, this memory TCP is cut into two portions along the cut line 18 having no common signal terminal 3 so that two memory TCPs respectively loaded with two chips 2 can be manufactured.

For example, modified examples as shown in FIGS. 6 to 14 are considered with respect to the memory TCP mentioned above. These modified examples will be sequentially explained on the basis of FIGS. 6 to 14.

Figure 6A:
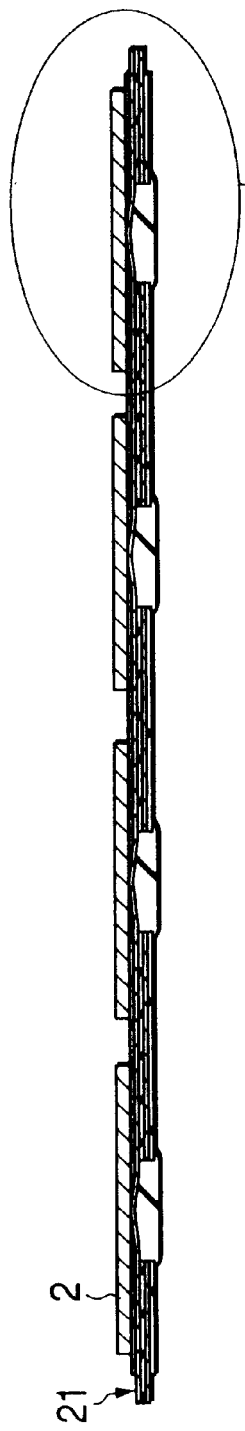
FIGS. 6A and 6B are respectively a cross-sectional view and a partially enlarged sectional view showing a memory TCP when bonding is performed such that an inner lead of a tape is separated from the chip main face as a modified example of this embodiment mode.
Figure 6B:
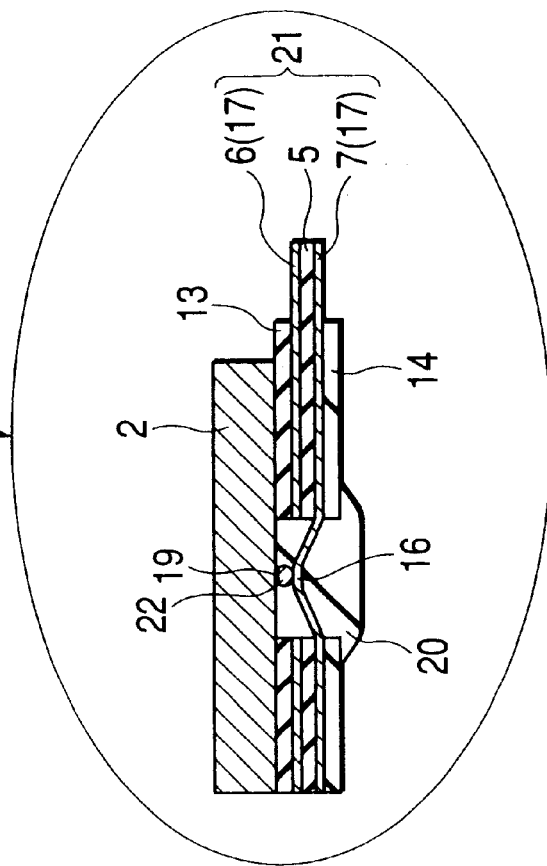

FIG. 6 is a cross-sectional view of the memory TCP showing a structure in which a wiring layer of the inner lead 16 of the tape 21 is bonded such that this wiring layer is separated from the main face of the chip 2. In this structure, for example, a bump 22 such as a gold ball is attached onto each pad 19 of each chip 2 as one example. A main face side of the chip 2 is mounted to a front face side of the tape 21. The inner lead 16 of a wiring layer on a rear side of the tape 21 and the bump 22 on each chip 2 are connected to each other. Thus, electric connection is made from each chip 2 to the common signal terminal 3 and the independent signal terminal 4. After the tape 21 and each chip 2 are connected, an electrically exposed portion such as a connection portion of the bump 22 on the chip 2 and the inner lead 16 on the tape 21 is similarly potted and sealed by seal resin 20.

Figure 7:
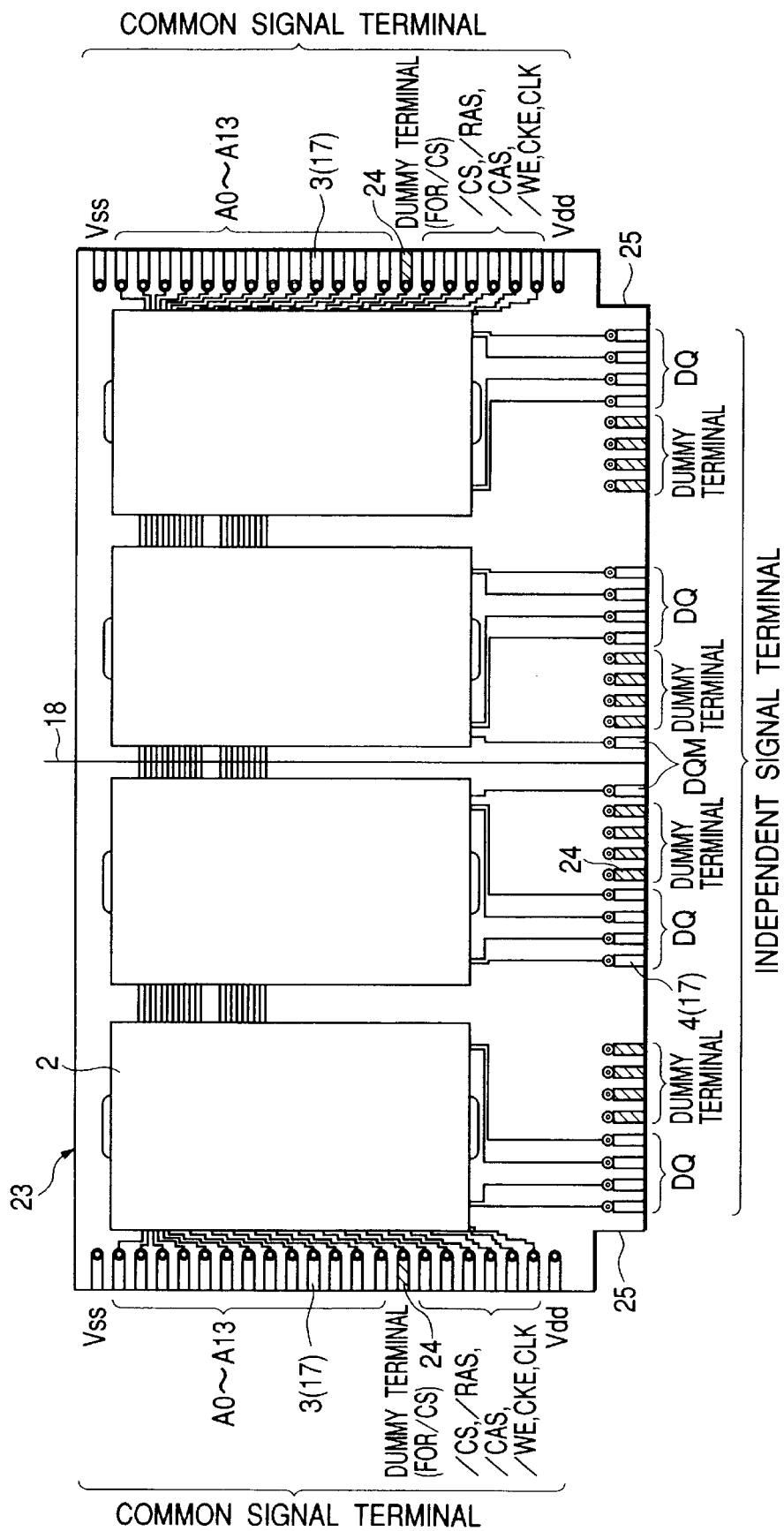
FIG. 7 is a plan view showing the memory TCP when the memory TCP is laminated as a modified example of this embodiment mode.

FIG. 7 is a plan view of the memory TCP showing a structure in which the memory TCP is laminated by using a tape 23 of two layers. In this structure, an independent signal terminal 4 and a dummy terminal 24 electrically unconnected to a chip 2 mounted to the tape 23 are arranged on one long side of the tape 23, and this memory TCP having these terminals is laminated. The independent signal terminal 4 at an upper stage and the dummy terminal 24 at a lower stage are connected to each other, and the dummy terminal 24 at the upper stage and the independent signal terminal 4 at the lower stage are connected to each other. Namely, the dummy terminal 24 for inputting the chip select signal /CS to discriminate the memory TCPs at the upper and lower stages from each other is arranged as the common signal terminal 3, and the dummy terminal 24 for inputting and outputting the input-output data DQ of the memory TCP at the upper stage (or lower stage) is arranged as the independent signal terminal 4 to laminate the memory TCPs at the two stages. Further, in a shape of the tape 23, a rectangular notch 25 is formed in e.g., a corner portion of an arranging side of the common signal terminal 3 and an arranging side of the independent signal terminal 4 to easily form a laminating layer using a tape-on-tape structure.

FIG. 8 is a plan view and a cross-sectional view of the memory TCP showing a structure in which a tape 26 of two layers is used and a lead 27 projected from this tape 26 is arranged. In this structure, the lead 27 is continuously extended from the common signal terminal 3 and the independent signal terminal 4, and is projected from the tape 26. Namely, only a copper foil of the lead 27 is projected from an insulating basic material 5, and is formed in a gull-wing shape so that an outer lead 17 is formed. In this structure, a layer can be easily laminated by changing a forming size of the outer lead 17 without the dummy terminal 24.

FIG. 9 is a plan view and a cross-sectional view of the memory TCP showing a structure when a tape 28 of one layer is used. In this structure, a tape 28 having a wiring pattern formed on only one side face of an insulating basic material 5 is used as shown in FIG. 9C.

Similar to signal wiring, wiring 29 of a ground electric potential and a power electric potential is constructed by a metallic thin film such as a copper foil. Common signal wiring 8 and independent signal wiring 9 are formed on the same face without crossing. Further, the lead 27 of a copper foil is projected from the insulating basic material 5, and is formed in a gull-wing shape so that an outer lead 17 is formed. In this structure, the layer of a lead-on lead structure can be laminated through the dummy terminal 24, and can be easily laminated by changing a length of the outer lead 17 and forming the gull wing shape without the dummy terminal 24. The number of manufacturing processes of the tape 28 of one layer is small in comparison with the tape of two layers so that the tape can be cheaply manufactured.

FIG. 10 is a plan view and a rear view of the memory TCP showing a structure in which a tape 30 of two layers is used, and a bypass capacitor 31 for a noise measure of a power source is mounted onto a chip mounting face of the tape 30. In this structure, a pad 33 connected from each of a ground electric potential plane pattern 10 and a power electric potential plane pattern 11 on a rear face of the tape 30 through a through hole 32 is formed on a front face of the tape 30. The bypass capacitor 31 as a passive element is mounted such that the bypass capacitor 31 is connected between the pad 33 connected to have a power electric potential and the pad 33 connected to have a ground electric potential. When a passive element such as a resistor is mounted in addition to the bypass capacitor 31, the passive element is connected and mounted between the pads on the front face of the tape 30. Noises are reduced by mounting the bypass capacitor 31 in proximity to a chip on the tape 30 of the memory TCP in comparison with a case in which the bypass capacitor 31 is mounted to a mounting substrate.

FIG. 11 is a plan view of the memory TCP showing a structure having a support lead 35 for improving mounting property in a tape 34. In this structure, plural support leads 35 electrically unconnected to the chip 2 are arranged on a side opposed to an arranging side of the independent signal terminal 4 in an arrangement and a shape similar to those of the lead 27 of the independent signal terminal 4. In this structure, four sides of the tape 34 can be supported by the leads 27 of the common signal terminal 3 and the independent signal terminal 4 and the support leads 35 so that the memory TCP can be stably mounted.

FIG. 12 is a plan view and a cross-sectional view of the memory TCP showing a structure having a frame 36 for preventing deformation in the tape 34 of FIG. 11. In this structure, for example, the frame 36 is constructed by a material such as a metal and plastic, and is fixed to a peripheral portion of the chip 2 such that the frame 3 surrounds the chip 2 on a front face of the tape 34. In this structure, deformation of the tape 34 such as warp, torsion and flexure can be prevented by the frame 36 in addition to the advantages of FIG. 11 so that the mounting property of the memory TCP can be further improved.

Figures 13A, 13B:
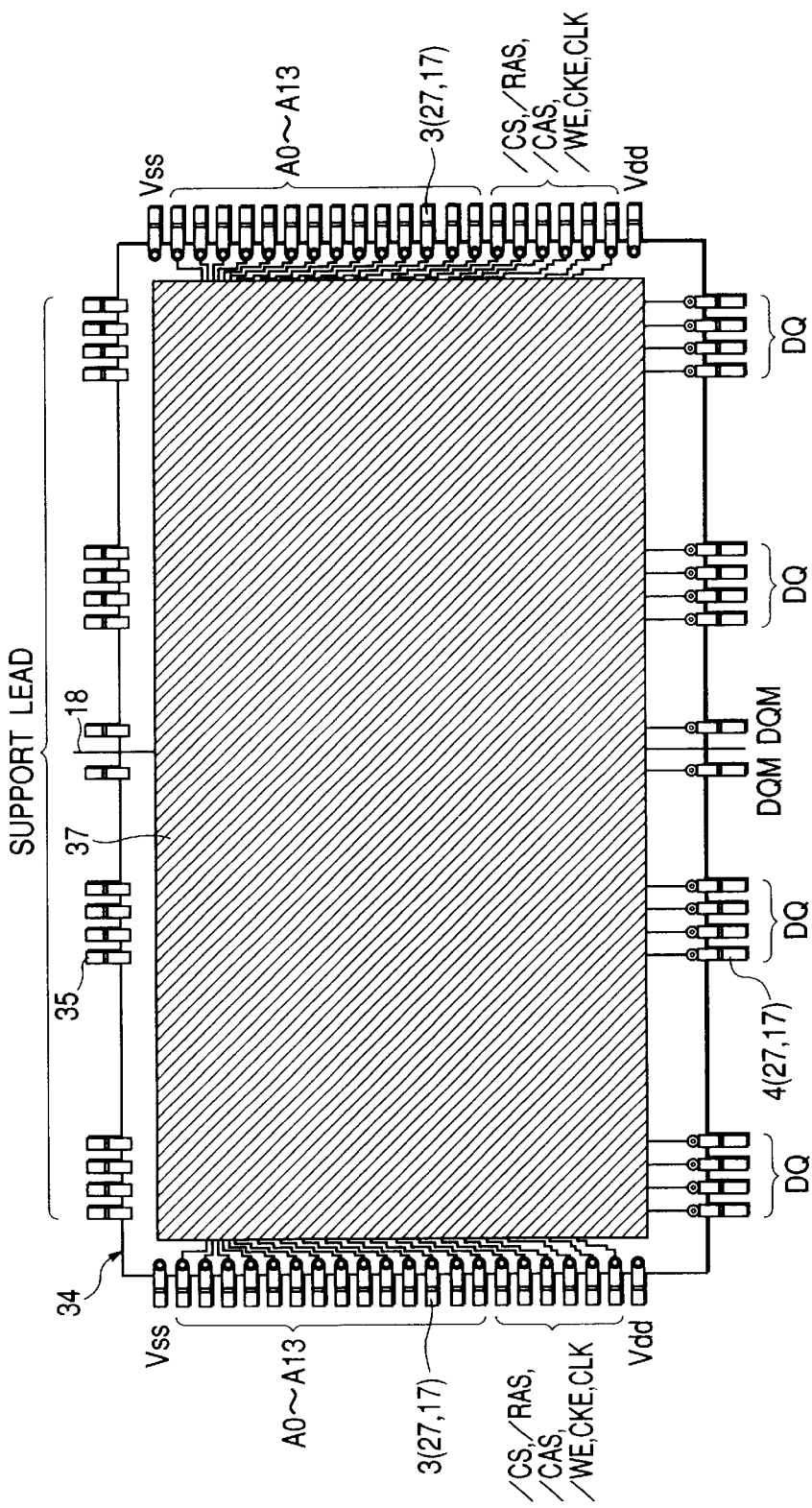
FIGS. 13A and 13B are respectively a plan view and a cross-sectional view showing the memory TCP of a structure having a metallic plate on a chip as a modified example of this embodiment mode.

FIG. 13 is a plan view and a cross-sectional view of the memory TCP showing a structure having a metallic plate 37 for improving mounting property and heat radiating property. In this structure, for example, the metallic plate 37 has a size able to cover four chips 2 mounted to the tape 34 of FIG. 11, and is directly fixed to a rear face of the chip 2 by an adhesive having good thermal conductivity. In this structure, in addition to the advantages of FIGS. 11 and 12, entire deformation of the tape 34 can be prevented by mainly fixing the chip 2, and heat generated from the chip 2 can be radiated through the metallic plate 37 so that the mounting property and the heat radiating property of the memory TCP can be improved.

Figure 14:
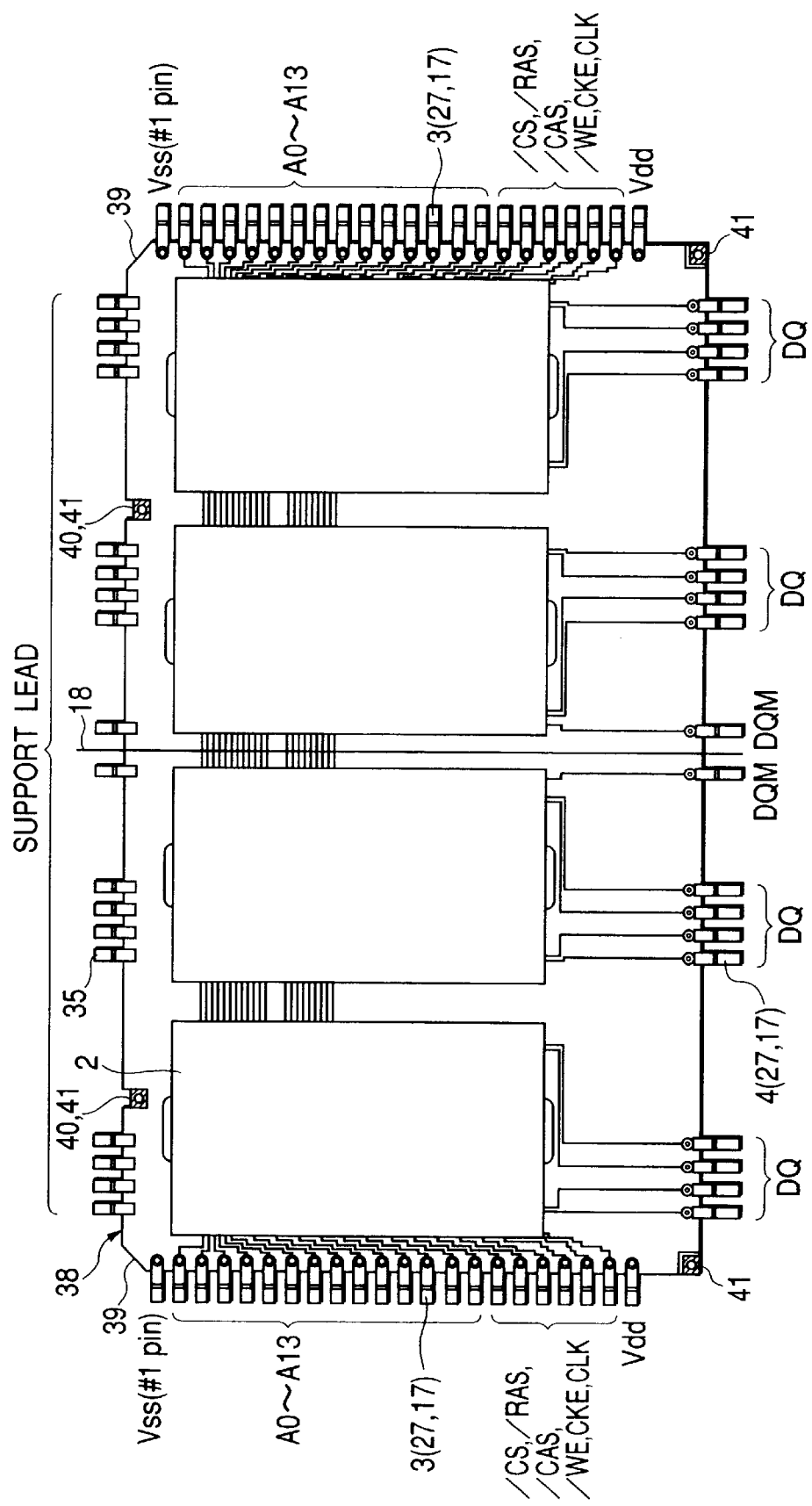
FIG. 14 is a plan view showing the memory TCP of a structure having display for recognizing the direction of a package and its position at a bonding time in the tape as a modified example of this embodiment mode.

FIG. 14 is a plan view of the memory TCP showing a structure having display for recognizing the direction of a package and its position at a bonding time in a tape 38. In this structure, for example, a cut portion 39 is formed by cutting a corner portion of an arranging side of the lead 27 of the common signal terminal 3 and an arranging side of the support lead 35 to show a first pin of the common signal terminal 3 as an index for pin display. Further, notches 40 different from each other in left and right packages are arranged in positions of left-right asymmetry in the respective packages to discriminate directions of the two divided packages from each other. In this structure, the directions of the packages can be recognized by the index for pin display using the cut portion 39 and the notches 40 in the package structure loaded with four chips and the package structure loaded with two chips divided into two portions.

A pattern 41 for position alignment is formed as a recognizing mark pattern at a bonding time in the corner portion of the arranging side of the lead 27 of the common signal terminal 3 and the arranging side of the independent signal terminal 4. For example, this pattern 41 has a structure in which the pattern 41 is projected from the insulating basic material 5 in a wiring layer of an inner lead 16 and its center is bored. Further, a pattern 41 for position alignment is similarly formed in a portion of the notch 40, and has a structure in which the pattern center is bored in the wiring layer of the inner lead 16. In this structure, the tape 38 and the chip 1 can be aligned with each other in position by using the pattern 41 for position alignment at the bonding time of the inner lead 16 in the package structure loaded with four chips and the package structure loaded with two chips.

Next, one example of the construction of a semiconductor module of this embodiment mode will be explained by FIG. 15 (a plan view and a rear view). For example, the semiconductor module of this embodiment mode is a memory module of an unbuffered DIMM of 168 pins in which the memory TCP is constructed by a 1-bank 16-bit type as in a portion A in FIG. 1, and the memory TCP of a structure as shown in FIGS. 2 and 3 is mounted. This semiconductor module is constructed by a rectangular substrate 51, eight memory TCPs 52 (four memory TCPs on a front face and four memory TCPs on a rear face) mounted to front and rear faces of this substrate 51, etc. Plural external terminals 53 are formed on one long side of the rectangular substrate 51, and an independent signal terminal 4 of the memory TCP 52 is arranged along an arranging direction of these external terminals 53.

For example, the substrate 51 is approximately formed in a rectangular plane shape, and the four TCPs 52 on the front face and the four TCPs 52 on the rear face are arranged in parallel with each other in a long side direction. The external terminals 53 are respectively arranged on one long side (downward on the front face of FIG. 15A, and upward on the rear face of FIG. 15B). The external terminals 53 mainly connected to a common signal terminal 3 of the memory TCP 52 on both the front and rear faces are arranged in a central portion of the substrate. The external terminals 53 connected to the independent signal terminal 4 on each of the front and rear faces are arranged on a short side except for the central portion.

In this substrate 51, adjacent memory TCPs 52 are connected to each other by a common signal wiring area 54, and the common signal wiring area 54 is arranged such that the common signal wiring area 54 extends to an external terminal 53 on one long side from a portion between the memory TCPs 52 in the central portion. Further, an independent signal wiring area 55 is arranged such that this independent signal wiring area 55 extends to the external terminal 53 on one long side from each memory TCP 52. A capacitor 56 for a noise measure of a power source, a resistor 57 for damping input-output data, etc. are mounted to the front and rear faces of the substrate 51. This substrate 51 is constructed by a multi-layer wiring layer substrate. For example, in this substrate 51, an insulating basic material is constructed by epoxy resin as one example, and a wiring layer is constructed by a metallic thin film such as a copper foil. Further, the wiring layer on each of the front and rear faces is coated with an insulating coat material for protection such as polyimide resin.

There are a terminal for inputting and outputting address signals A0 to A13, a low address strobe signal /RAS, a column address strobe signal /CAS, a write enable signal /WE, clock enable signals CKE0, CKE1, clock signals CK0 to CK3, check bit signals CB0 to CB7, chip select signals /S0 to /S3, bank select address signals BA0, BA1, a write protect signal WP, serial input-output data SDA, a serial clock signal SCL, serial address signals SA0 to SA2, etc., and a terminal for supplying a ground electric potential Vss, a power electric potential Vdd, etc. as terminals for a common signal in the external terminal 53. There is a terminal for inputting and outputting input-output data DQ0 to DQ63, data mask signals DQMB0 to DQMB7, etc. as a terminal for an independent signal.

For example, modified examples as shown in FIGS. 16 to 24 are considered with respect to the memory module mentioned above. These modified examples will be sequentially explained on the basis of FIGS. 16 to 24.

FIG. 16 is a plan view and a rear view showing the memory module of a registered DIMM of 168 pins. This memory module is set to a DIMM of 64 bits+8 bits in which 8 bits are added for an ECC (Error Checking and Correcting) mode for removing a memory cell soft error caused at random, and a memory TCP 59 of these 8 bits is additionally mounted to the front face of a substrate 58, and nine memory TCPs 52, 59 in total are mounted.

Further, in the substrate 58, a resin seal type semiconductor device using a lead terminal between an external terminal 53 and the memory TCPs 52, 59 is arranged in addition to a passive element such as a capacitor 56 for a noise measure of a power source and a resistor 57 for damping input-output data. For example, a TSOP (Thin Small Outline Package) of an EEPROM 60 is mounted onto a front face of the substrate 58, and a TSOP such as a register 61, a PLL (Phase Locked Loop) 62 and an inverter 63 is mounted onto a rear face of the substrate 58. Thus, a signal from a system is held in the register 61, and operations of the memory TCPs 52, 59 can be controlled by this register 61 in a state separated from the system.

The external terminal 53 of the substrate 58, a common signal wiring area 54 and an independent signal wiring area 55 are arranged in accordance with a rule similar to that of FIG. 15. Signal allocation of the external terminal 53 is approximately similar to that of the unbuffered DIMM of FIG. 15 except that a don't use signal DU and a registered enable signal REGE are added. Further, a low address strobe signal, a column address strobe signal and a power electric potential are respectively set to /RE, /CE and Vcc.

FIG. 17 is a plan view and a rear view showing the memory module of a SO (Small Outline) DIMM of 144 pins. This memory module is set to a SODIMM of 64 bits in which a substrate 64 having a small size in comparison with FIGS. 15 and 16 is used, and two memory TCPs 52 are mounted on each of front and rear faces of this substrate 64 so that the four memory TCPs 52 in total are mounted.

The external terminal 53 of the substrate 64, the common signal wiring area 54 and the independent signal wiring area 55 are arranged in accordance with a rule similar to that of FIGS. 15 and 16. In the external terminal 53, address signals A0 to A13, a low address strobe signal /RAS, a column address strobe signal /CAS, a write enable signal /WE, clock enable signals CKE0, CKE1, bank select address signals BA0, BA1, serial input-output data SDA, a serial clock signal SCL, input-output data DQ0 to DQ63, data mask signals DQMB0 to DQMB7, a ground electric potential Vss and a power electric potential Vdd are similar to those in FIGS. 15 and 16. The number of clock signals CLK0, CLK1 and chip select signals /S0, /S1 are reduced in accordance with the number of memory TCPs 52.

Figure 18C:
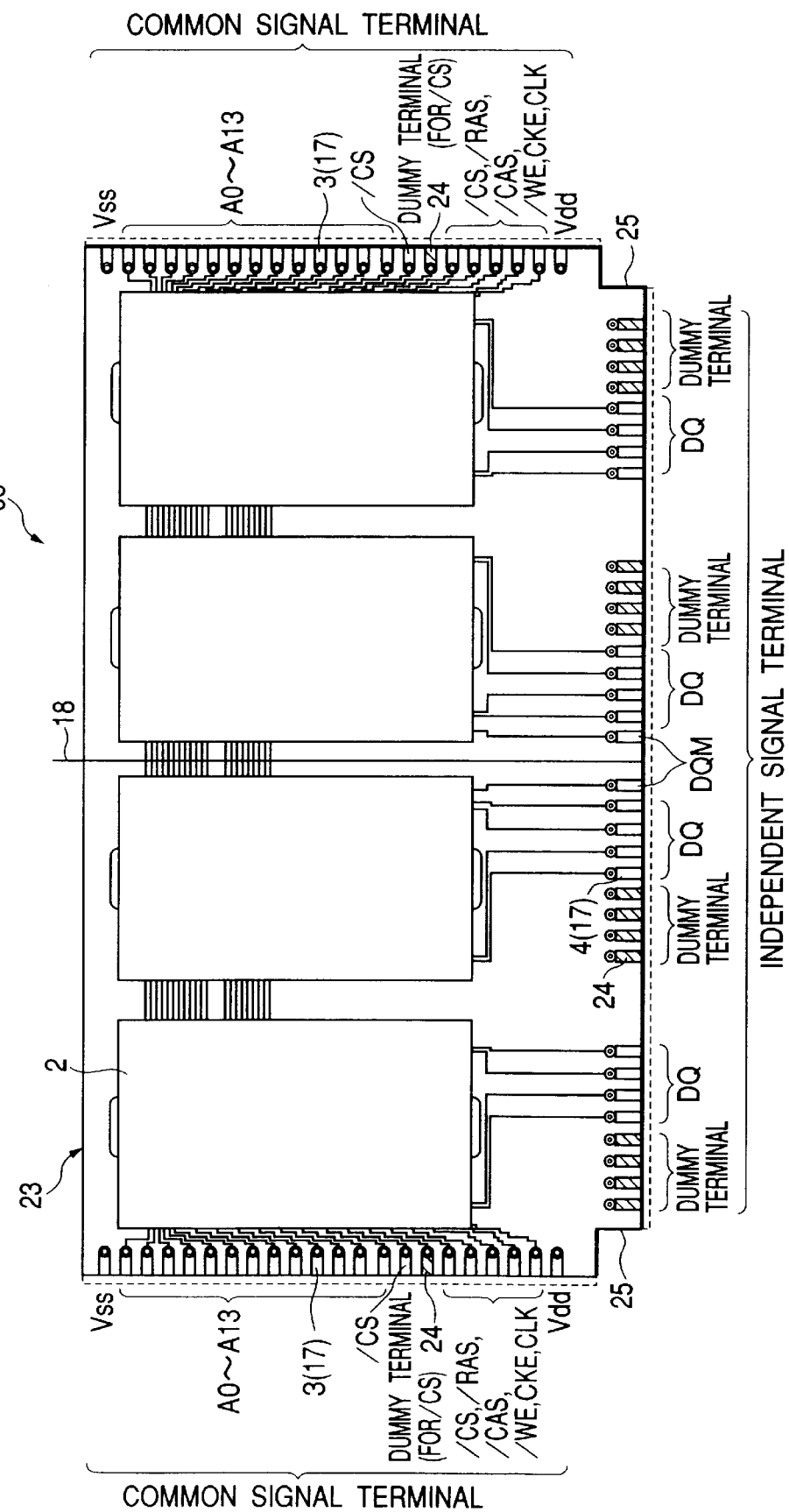

FIG. 18A is a cross-sectional view showing a memory module in which memory TCPs 66, 67 are laminated on a substrate 65, and are mounted by a tape-on-tape structure. FIG. 18B is an enlarged view of a connection portion of signal terminals 68, 69 of this memory module. FIG. 18C is a plan view of the memory TCP 67 laminated at an upper stage. In this memory module, the memory TCP 66 has a structure having a dummy terminal 24 as shown in FIG. 7, and uses a two-layer tape having signal terminals of wiring patterns 6, 7 on front and rear faces of an insulating basic material 5. In the memory TCP 67, shapes and lengths of the signal terminals are respectively different from each other as shown in FIG. 18C, and the memory TCP 67 is formed such that the dummy terminal 24 and a terminal of the input-output data DQ are not overlapped in lamination with the memory TCP 66. The memory TCPs 66, 67 of these two kinds are used and are overlapped and mounted at two stages onto only the front face of the substrate 65. Namely, the memory TCP 66 having a long signal terminal 68 is arranged at the upper stage, and the memory TCP 67 having a short signal terminal 69 is arranged at the lower stage. The signal terminal 68 on the rear face of the memory TCP 66 at the upper stage and the signal terminal 69 on the front face of the memory TCP 67 at the lower stage are connected to each other by a connection material 70 such as solder. Further, the signal terminal 69 on the rear face of the memory TCP 67 at the lower stage is connected onto a substrate pad of the substrate 65 by the connection material 70. Thus, the memory TCPs 66, 67 at the upper and lower stages and the substrate 65 can be electrically connected.

FIG. 19 is a cross-sectional view showing a memory module in which memory TCPs 72, 73 are laminated on a substrate 71, and are mounted by a lead-on-tape structure. In this memory module, the memory TCP 72 has a lead 27 projected from an insulating basic material 5 of a two-layer tape as shown in FIG. 8, and the memory TCP 73 uses a two-layer tape having signal terminals on front and rear faces of the insulating basic material 5 as shown in FIG. 7. The memory TCPs 72 and 73 are overlapped and mounted at two stages on only a front face of the substrate 71. Namely, the memory TCP 72 of FIG. 8 is arranged at an upper stage, and the memory TCP 73 of FIG. 7 is arranged at a lower stage. A signal terminal 74 using the lead 27 of the memory TCP 72 at the upper stage and a signal terminal 75 on a front face of the memory TCP 73 at the lower stage are connected to each other by a connection material 70. Further, the signal terminal 75 on a rear face of the memory TCP 73 at the lower stage is connected onto a substrate pad of the substrate 71. Thus, the memory TCPs 72, 73 at the upper and lower stages and the substrate 71 can be electrically connected.

FIG. 20 is a cross-sectional view showing a memory module in which memory TCPs 77, 78 are laminated on a substrate 76, and are mounted by a lead-on-board structure. This memory module has a structure having a lead 27 projected from an insulating basic material 5 of a two-layer tape as shown in FIG. 8. The memory TCPs 77, 78 of two kinds different from each other in shape and length of the lead 27 are used, and are overlapped and mounted at two stages only on a front face of the substrate 76. Namely, the memory TCP 77 having a long lead 27 is arranged at an upper stage, and the memory TCP 78 having a short lead 27 is arranged at a lower stage. A signal terminal 79 using the lead 27 of the memory TCP 77 at the upper stage is connected onto a substrate pad outside the substrate 76 by a connection material 70, and a signal terminal 80 using the lead 27 of the memory TCP 78 at the lower stage is connected onto an inside substrate pad by the connection material 70. Thus, the memory TCPs 77, 78 at the upper and lower stages and the substrate 76 can be electrically connected.

As shown in FIG. 20, when the memory TCPs 77, 78 of two kinds different from each other in shape and length of the lead 27 are used in a structure having the lead 27 as shown in FIG. 8, the memory TCPs 77, 78 at the upper and lower stages and the substrate 76 can be electrically connected by lamination mounting of the lead-on-lead structure instead of the construction in which the signal terminals 79, 80 using the lead 27 are connected to the substrate pads outside and inside the substrate 76. In this lamination mounting of the lead-on-lead structure, the signal terminal 79 of the memory TCP 77 at the upper stage having the long lead 27 and the signal terminal 80 of the memory TCP 78 at the lower stage having the short lead 27 are connected to each other by the connection material 70. Further, the signal terminal 80 of the memory TCP 78 at the lower stage is connected onto the substrate pad of the substrate 76.

Figures 21A, 21B:
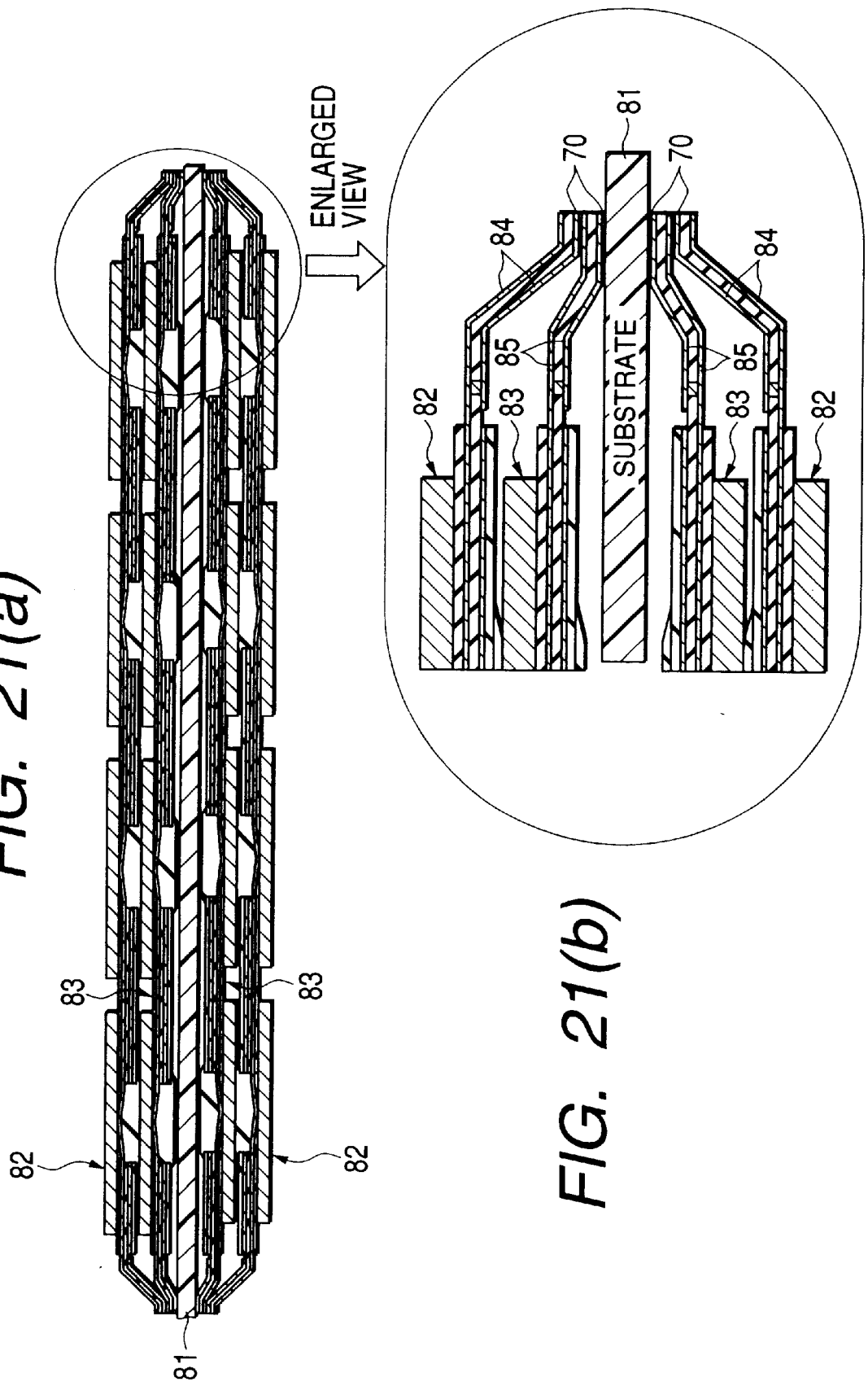
FIGS. 21A and 21B are respectively a cross-sectional view and a partially enlarged sectional view showing a memory module laminated and mounted by the lead-on-board structure on both faces of a substrate as a modified example of this embodiment mode.

FIG. 21 is a cross-sectional view showing a memory module in which memory TCPs 82, 83 are laminated on both faces of a substrate 81, and are mounted by a tape-on-tape structure. In this memory module, the memory TCPs are overlapped and mounted at two stages on only a front face of the substrate as shown in FIG. 18, and the memory TCPs 82, 83 are further overlapped and mounted at two stages on a rear face of the substrate 81 as well as the front face. Thus, signal terminals 84, 85 are separately connected on the front and rear faces, and the memory TCPs 82, 83 at upper and lower stages and the substrate 81 can be electrically connected. Accordingly, it is possible to set a construction in which capacity and input-output bits are twice in comparison with FIG. 18.

Figure 22A:
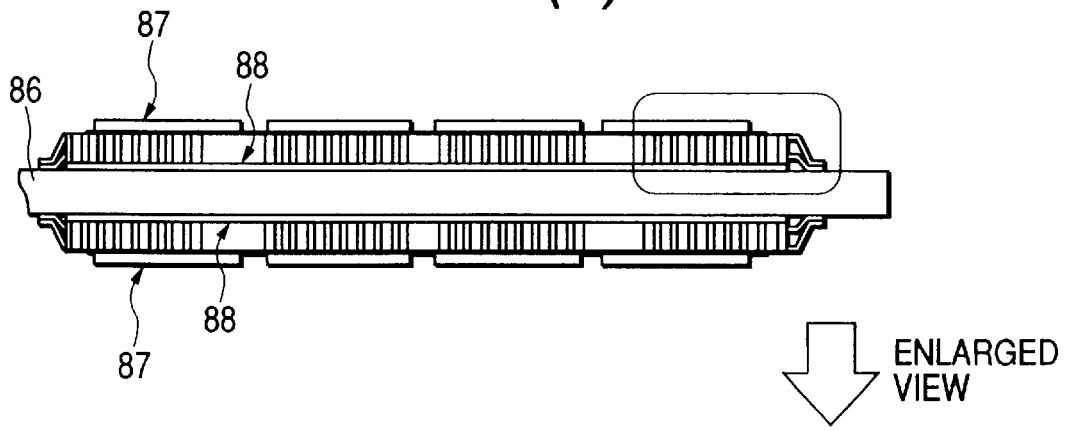
FIGS. 22A, 22B and 22C are respectively a side view and a schematic perspective view showing the connection of a signal terminal of an independent signal in the memory module laminated and mounted by the lead-on-board structure on both the faces of the substrate, and a plan view showing the memory TCP as a modified example of this embodiment mode.
Figure 22B:
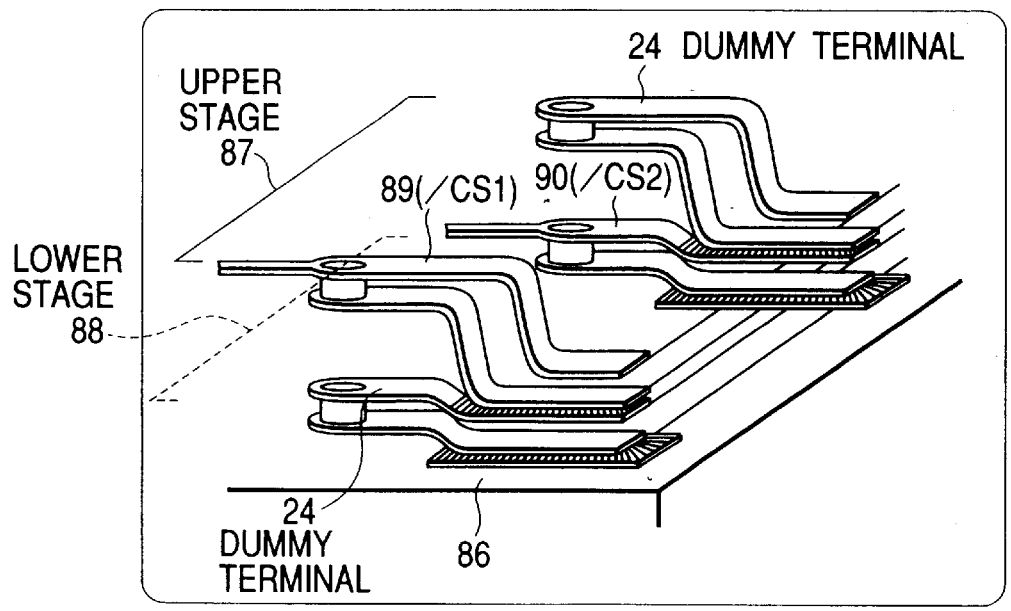
Figure 22C:
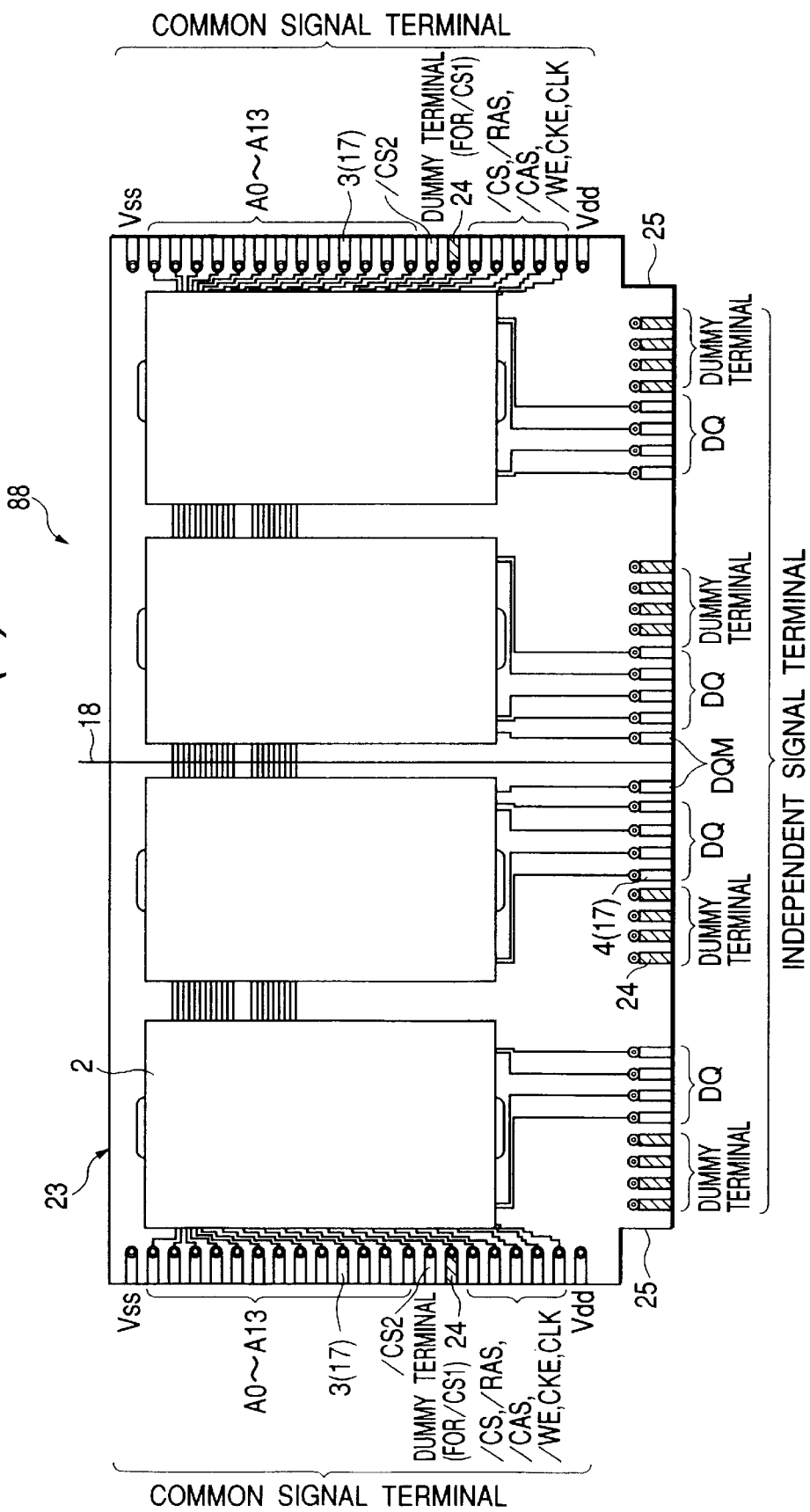

FIGS. 22A and 22B are respectively a side view and a schematic perspective view showing connection of signal terminals 89, 90 of an independent signal in a memory module in which memory TCPs 87, 88 are laminated on both faces of a substrate 86 as shown in FIG. 21, and are mounted by the tape-on-tape structure. FIG. 22C is a plan view showing the memory TCPs. The connection of these signal terminals 89, 90 will be explained by using an example of a chip select signal /CS. As shown in FIG. 7, a dummy terminal 24 is arranged, and a signal terminal 89 of a chip select signal /CS1 and the dummy terminal 24 adjacent to this signal terminal 89 are arranged in the memory TCP 87 at an upper stage. In contrast to this, in the memory TCP 88 at a lower stage, a dummy terminal 24 is arranged in a position corresponding to the chip select signal /CS1, and a signal terminal 90 of a chip select signal /CS2 is arranged in a position corresponding to the dummy terminal 24 in a reverse arrangement. When the memory TCPs 87, 88 of two kinds are used and laminated, the signal terminal 89 of the chip select signal /CS1 of the memory TCP 87 at the upper stage and the dummy terminal 24 of the memory TCP 88 at the lower stage are connected to each other. Further, the dummy terminal 24 of the memory TCP 87 at the upper stage and the signal terminal 90 of the chip select signal /CS2 of the memory TCP 88 at the lower stage are connected to each other.

A signal terminal 89 of input-output data DQ and a dummy terminal 24 adjacent to this signal terminal 89 are similarly arranged in the memory TCP 87 at the upper stage with respect to an independent signal for inputting and outputting the input-output data DQ. In contrast to this, in the memory TCP 88 at the lower stage, a dummy terminal 24 is arranged in a position corresponding to the input-output data DQ, and a signal terminal 90 of the input-output data DQ is arranged in a position corresponding to the dummy terminal 24 in a reverse arrangement. The signal terminal 89 of the input-output data DQ of the memory TCP 87 at the upper stage and the dummy terminal 24 of the memory TCP 88 at the lower stage are connected to each other. The dummy terminal 24 of the memory TCP 87 at the upper stage and the signal terminal 90 of the input-output data DQ of the memory TCP 88 at the lower stage are connected to each other.

Figure 23:
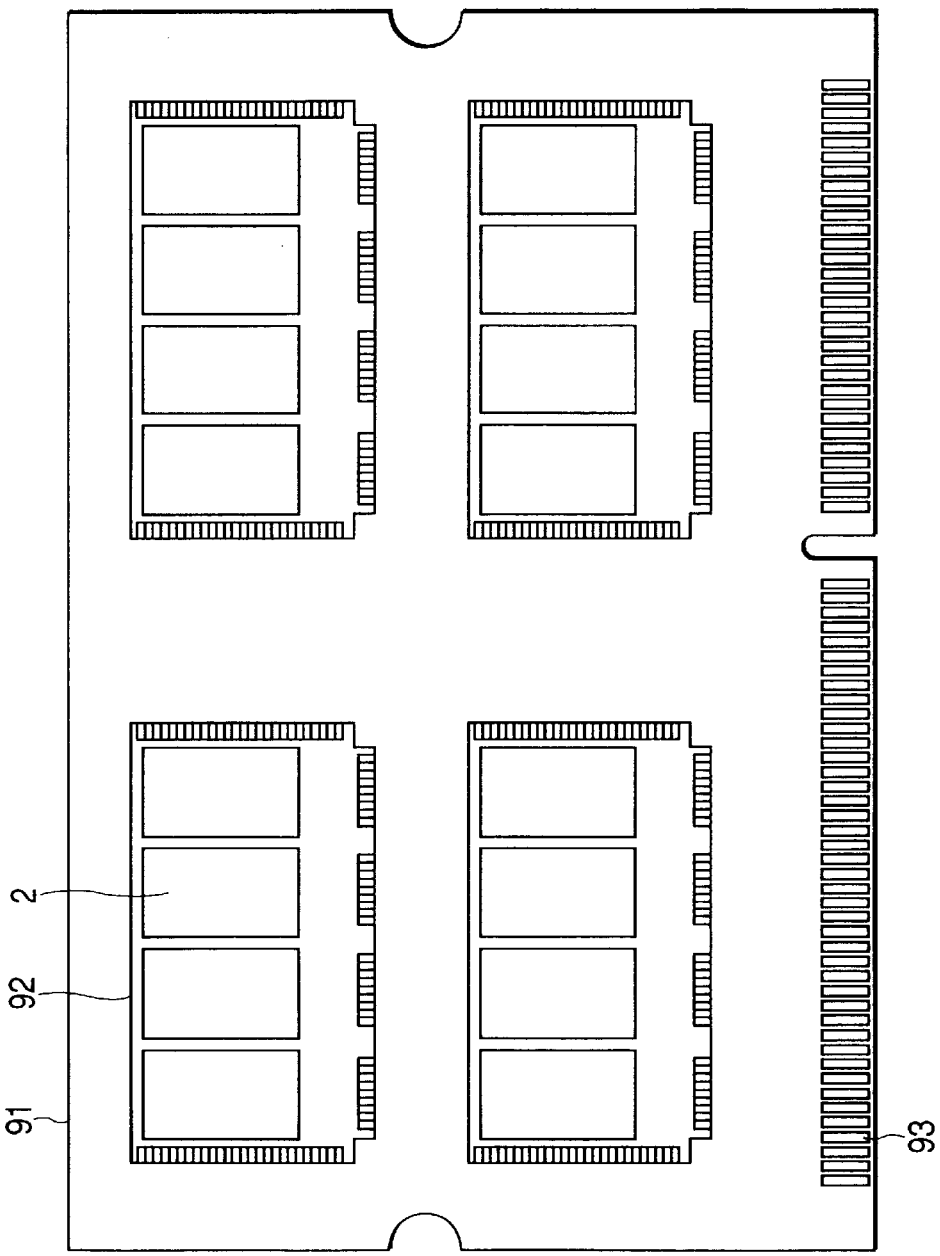
FIG. 23 is a plan view showing the memory module of a structure in which an arrangement of the memory TCP is changed as a modified example of this embodiment mode.

FIG. 23 is a plan view showing a memory module having a structure in which the arrangement of memory TCPs is changed with respect to a memory module mounting the memory TCPs onto both faces of a substrate as shown in FIG. 15. In this memory module, four memory TCPs 92 on each of front and rear faces of the substrate 91 are arranged in two rows×two columns in long and short side directions. In this structure, plural external terminals 93 are also formed on one long side of the rectangular substrate 91, and independent signal terminals 4 of the memory TCPs 92 are arranged in parallel with each other along an arranging direction of these external terminals 93.

Figure 24:
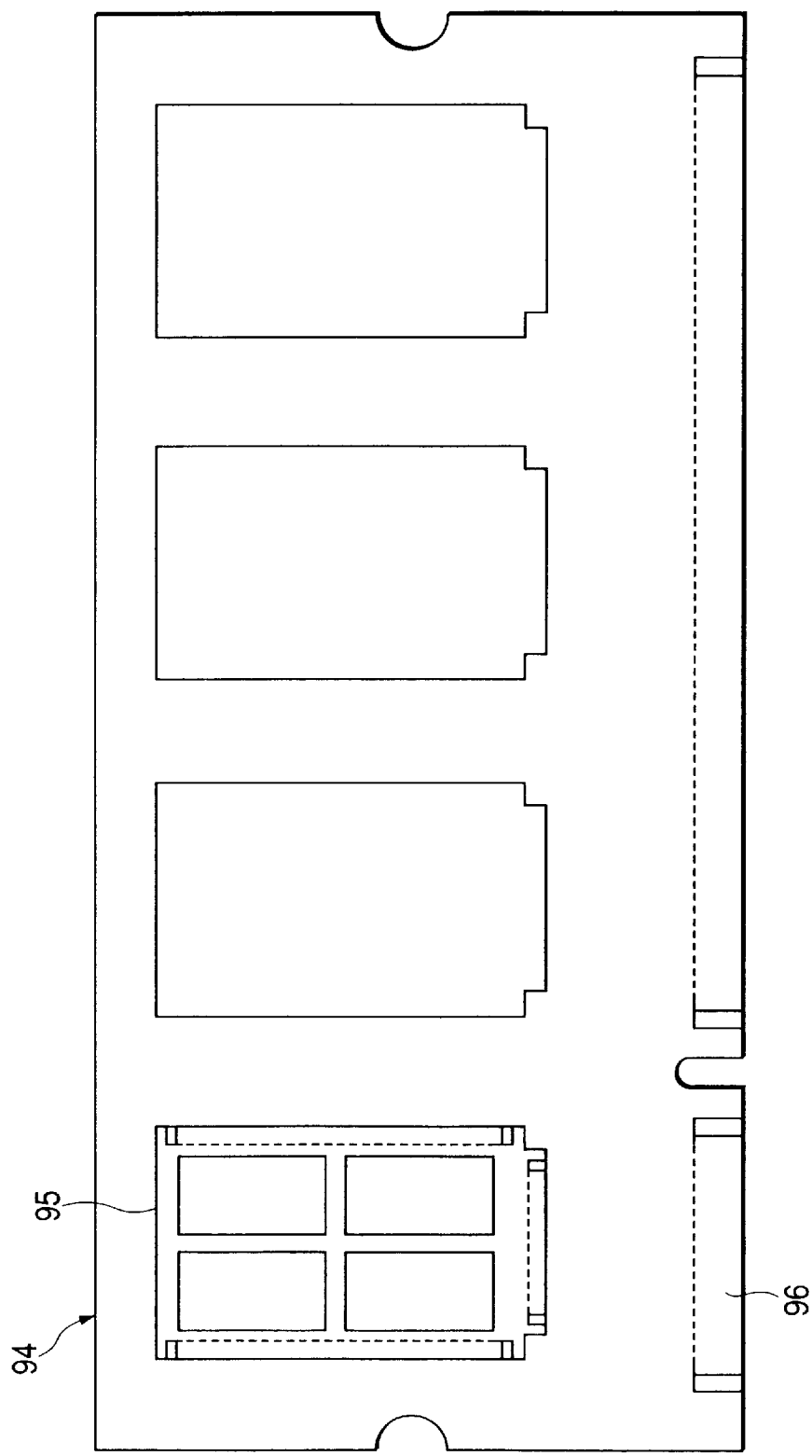
FIG. 24 is a plan view showing the memory module of an unbuffered DIMM (2-bank 8-bit type) as a modified example of this embodiment mode.

FIG. 24 is a plan view showing a memory module of an unbuffered DIMM in which the memory TCP is constructed by a 2-bank 8-bit type as shown by a portion B in FIG. 1, and the 2-bank 8-bit type of a multi-chip package of four chips is set to an example. Four chips of the 2-bank 8-bit type are mounted to each memory TCP 95 mounted to this memory module. In the memory module mounting this memory TCP 95 thereto, four memory TCPs 95 are arranged in parallel with each other in a long side direction on each of the front and rear faces of a substrate 94. In this structure, plural external terminals 96 are formed on one long side of the rectangular substrate 94, and independent signal terminals 4 of the memory TCPs 95 are arranged in parallel with each other along an arranging direction of these external terminals 96.

One example of manufacturing methods of the memory TCP of this embodiment mode and the memory module mounting this memory TCP thereto will next be explained by FIG. 25 (a flow chart of the memory TCP) and FIG. 26 (a flow chart of the memory module).

In manufacture of the memory TCP, a chip 2, a series of tapes 1 wound around a tape reel, etc., seal resin 20, etc. are first prepared.

In a bumped process (S101), a bump 22 is attached onto a pad 19 of the chip 2 by mounting a gold ball. This process is required in a structure as shown in FIG. 6, but it is not necessary to form the bump 22 in a structure as shown in FIG. 3 so that the bump 22 can be omitted.

In an inner lead bonding process (S102), the tape 1 and the chip 2 are aligned with each other in position, and direct bonding is performed by pressing a bonding tool from above an inner lead 16. In this process, the pad 19 of an aluminum electrode is heated and pressurized by bonding at a single point every one pin in the structure as shown in FIG. 3, and the bump 22 is heated and pressurized with all pins as one block in the structure as shown in FIG. 6.

In an external appearance inspecting process (S103), a connecting state of the inner lead 16 of the tape 1, and the pad 19 on the chip 2, or the bump 22 after the inner lead bonding is inspected to confirm the existence of a defect in connection, etc. Here, when it is confirmed as a good product, it proceeds to subsequent processes. In contrast to this, when it is not confirmed as a good product, this product is removed as an inferior product.

In an inner lead portion resin coating and hardening process (S104), seal resin 20 is potted and sealed in an electrically exposed portion such as a connecting portion of the pad 19 on the chip 2, or the bump 22 and the inner lead 16 on the tape 1 with respect to the good product confirmed in the external appearance inspection.

In a tape cut process (S105), a series of tapes 1 mounting chips 2 thereto and having common signal terminals 3 formed every four chips is cut such that the common signal terminals 3 are divided into two portions. The tapes 1 have a shape and a size suitable for mounting to a test socket by this cutting of the tapes 1.

In an open/short test process (S106), an open/short inspection of input-output pins of the common signal terminal 3, the independent signal terminal 4, etc. are made before burn-in. When it is here confirmed as a good product, it proceeds to subsequent processes. In contrast to this, when it is not judged as a good product, this product is removed as an inferior product.

In a burn-in process (S107), a rated power voltage or a power voltage exceeding this rated power voltage is applied to the good product confirmed in the open/short test in a predetermined temperature condition. Thus, screening is performed while a signal for approximately performing the actual operation is applied to each memory circuit, etc.

In an electric characteristics test process (S108), a DC test such as the open/short inspection between input and output pins, a leak electric current inspection, and the measurement of a power electric current (an operating time and a standby time), and a function test such as a functional inspection for performing writing/reading operations using a predetermined test pattern with respect to the memory circuit, and the measurement of a timing margin are made. Here, when it is confirmed as a good product, it proceeds to subsequent processes. In contrast to this, when it is not confirmed as a good product, this product is removed as an inferior product.

In an outer shape cut process (S109), the tape 1 loaded with four chips 2 is cut near the chips 2 with respect to the good product confirmed in the electric characteristics test while the common signal terminal 3 and the independent signal terminal 4 are left. Thereafter, an outer lead 17 is formed. Thus, a memory TCP 52 mounting the four chips 2 to the tape 1 is formed. Further, the memory TCP 52 is cut into two portions along a cut line 18 with no common signal terminal 3 so that two memory TCPs mounting two chips 2 to the tape 1 are formed.

In an external appearance inspecting process (S110), an external appearance of the memory TCP 52 loaded with four chips (the memory TCPs loaded with two chips) is inspected as a final inspection of the memory TCP 52. Thus, the memory TCP 52 confirmed as a good product is stored to a conveying tray within a manufacturing process of the memory TCP, and can be supplied to a memory module manufacturing process.

In this memory TCP manufacturing process, for example, when a KGD (Known Good Dia) and a WPP (Wafer Process Package) selected as good products of chips 2 are used, an electric characteristics test process (S111) is performed after the inner lead portion resin coating and hardening process (S104). Thereafter, it is transferred to the outer shape cut process (S109), or the tape is wound around a tape reel, and can be supplied to the memory module manufacturing process.

Subsequently, a substrate 51, a memory TCP 52, mounting parts such as a capacitor 56 and a resistor 57, and solder paste are first prepared in manufacture of the memory module.

In a solder coating (rear face) process (S201), a pad on the rear face of the substrate 51 is coated with the solder paste by a printing press.

In a parts mounting process (S202), the memory TCP 52 and a passive element such as the capacitor 56 and the resistor 57 are mounted to the rear face of the substrate 51.

In a soldering process (S203), the pad of the substrate 51 is connected to terminals of the memory TCP 52 of loaded mounting parts, the capacitor 56 and the resistor 57. In this process, for example, when a terminal of the memory TCP 52 has a tape structure, this terminal is joined by press attachment by melting the solder paste. In contrast to this, when this terminal has a lead structure, this terminal is soldered by heating and melting the solder paste by reflow.

In a solder coating (front face) process (S204) and a parts mounting process (S205) and a soldering process (S206), similar to solder coating, parts mounting and soldering to the rear face of the substrate 51, the solder coating, the parts mounting and the soldering are performed on the front face of the substrate 51.

In an external appearance inspecting process (S207), the mounting of parts onto the rear and front faces of the substrate 51, and a connecting state of the pad on the substrate 51 and terminals of the mounted parts after the soldering process is inspected. Thus, it is confirmed whether there is a defect in connection or not. When it is confirmed as a good product, it proceeds to subsequent processes. In contrast to this, when it is not confirmed as a good product, this product is removed as an inferior product.

In an electric characteristics test process (S208), a DC test such as an open/short inspection between external terminals, a leak electric current inspection, and the measurement of a power electric current (an operating time and a standby time), and a function test such as a functional inspection for performing writing/reading operations using a predetermined test pattern with respect to a memory circuit, and the measurement of a timing margin are made with respect to the good product confirmed in the external appearance inspection. When it is here confirmed as a good product, it proceeds to subsequent processes. In contrast to this, when it is not confirmed as a good product, this product is removed as an inferior product.

In a case mounting process (S209), with respect to the good product confirmed in the electric characteristics test, a case is mounted to the memory module so as to cover the memory TCP 52 mounted to the substrate 51, and expose the external terminal 53.

In a product display process (S210), a product name, a lot number, etc. are printed to the memory module mounting the case thereto.

In a forwarding inspection process (S211), a final inspection is made before the memory module completed in product display is forwarded. Thus, the memory module confirmed as a good product can be forwarded as a product.

In this memory module manufacturing process, when the KGD and the WPP are used as the chip 2 in the memory TCP manufacturing process, the KGD and the WPP wound around the tape reel and supplied are cut from the tape 1, and are simultaneously mounted in an outer shape cut and simultaneous mounting process (S212). Thereafter, processing from parts mounting processes (S202, S205) of other mounting parts is performed so that the memory module can be forwarded as a good product.

Accordingly, in accordance with the memory TCP of this embodiment mode, common signal terminals 3 are arranged on two short opposed sides, and an independent signal terminal 4 is arranged on one long side. The common signal terminals 3 on the two sides are electrically connected to each other by common signal wiring 8. Accordingly, the following effects can be obtained.

(1) Since the common signal terminals 3 are arranged on both short sides of the tape 1 and the independent signal terminal 4 is arranged on a lower long side of the tape 1, it is closer to a pin arrangement of the external terminal 53 arranged on a lower long side of the memory module so that design of the substrate 51 can be simplified.

(2) Since the common signal terminal 3 and the independent signal terminal 4 are arranged with left-right mirror symmetry, layout of these terminals can be performed on the substrate 51 irrespective of front and rear sides, and left and right sides so that the degree of freedom of the arrangement of the substrate 51 can be improved. Further, two mirror packages can be obtained by cutting the tape 1 at its center.

(3) A pad pitch (e.g., 100 to 50 $\mu$m) of a narrow pad 19 of the chip 2 can be enlarged to a lead pitch (e.g., 0.5 mm or more) of a wide outer lead 17 of the tape 1 as an interposer structure.

(4) A dummy terminal 24 for lamination mounting is attached, and the independent signal terminal 4 divisionally drawn out between layers is connected to the substrate 51 through this dummy terminal 24 so that the layers can be easily laminated. Therefore, layers are also easily laminated and mounted with respect to a signal terminal on the tape 1.

(5) In a structure in which the tape 26 of two layers is used and the lead 27 projected from this tape 26 is arranged, layers can be easily laminated by changing a forming size of the outer lead 17 even when there is no dummy terminal 24.

(6) In a structure in which the tape 28 of one layer is used and the lead 27 projected from this tape 28 is arranged, cost of the tape 28 is reduced, and layers can be laminated by the lead-on-lead structure through the dummy terminal 24. Further, layers can be easily laminated by changing a length of the outer lead 17 even when there is no dummy terminal 24.

(7) A support lead 35 is arranged on a side opposed to an arranging side of the independent signal terminal 4 so that the tape 34 can be supported by the leads 27 of the common signal terminal 3 and the independent signal terminal 4 and the support lead 35. Therefore, the memory TCP 52 can be stably mounted and mounting property can be improved.

(8) A frame 36 is fixed so as to surround the chip 2 on a front face of the tape 34 so that deformation of the tape 34 such as warp, torsion and flexure can be prevented, and mounting property of the memory TCP 52 can be improved.

(9) Since a metallic plate 37 is directly fixed to the chip 2 mounted to the tape 34, deformation of the entire tape can be prevented, and heat generated from the chip 2 can be radiated through the metallic plate 37. Accordingly, both mounting property and heat radiating property of the memory TCP 52 can be improved.

(10) Notches 40 are arranged in left-right asymmetrical positions with respect to an index for pin display in a cut portion 39 of a corner portion of the tape 38 so that the direction of a package can be recognized even in a package structure loaded with four chips and a package structure loaded with two chips divided into two portions.

(11) A pattern 41 for position alignment having a central boring structure is arranged so that the tape 1 and the chip 2 can be aligned with each other in position by using the pattern 41 for position alignment as a recognizing mark at a bonding time of the inner lead 16 even in a package structure loaded with four chips and a package structure loaded with two chips.

(12) It is possible to simultaneously make an open/short test, burn-in and an electric characteristics test of plural chips 2 so that burn-in and test cost can be reduced.

Further, in accordance with the memory module of this embodiment mode, the memory TCP 52 having the effects mentioned above is mounted, and plural external terminals 53 are formed on one long side of the rectangular substrate 51. The memory TCP 52 is mounted such that the independent signal terminals 4 of the memory TCP 52 are arranged along an arranging direction of these external terminals 53. Accordingly, the following effects can be obtained.

(21) Since an occupying area of the outer lead 17 occupied in one chip is small in comparison with the memory TCP of one chip, high density mounting to the substrate 51 can be performed so that the memory module can be highly integrated.

(22) Since main wiring is completed on the tape 1, wiring of the substrate 51 is simplified, and the number of through holes is greatly reduced, and there is a possibility of a reduction in the number of layers of the substrate 51 so that cost of the substrate 51 can be reduced.

(23) The number of mounted packages and mounting cost can be reduced in comparison with the memory module of the same capacity mounting the chip 2 of the same capacity thereto. Further, the number of connection points is reduced, and cost required to inspect a connecting portion is reduced so that mounting cost of the memory module can be reduced.

(24) A large capacity memory module equivalent to the next generation memory module is realized at the same size, and it contributes to the compactness of a system such as a PC (Personal Computer) and a WS (Work-Station), and an increase in capacity of a built-in memory so that the system can be made compact and increased in capacity.

(25) In the relation of the memory TCP and the memory module, a 64-bit 2-bank can be constructed by a 1-bank 16-bit type and a 2-bank 8-bit type using a collection of four chips, a 1-bank 8-bit type and a 2-bank 4-bit type using a collection of two chips, or a 1-bank 32-bit type and a 2-bank 16-bit type using a collection of eight chips.

As mentioned above, the invention made by the present inventors has been concretely explained on the basis of its embodiment modes. However, the invention is not limited to these embodiment modes, but can be variously changed in a range in which no features of the invention are departed.

For example, in the embodiment modes, the invention made by the present inventors is applied to the memory module in a technical field belonging to this invention, but is not limited to this case. Further, the invention can be also applied to a memory built-in product, e.g., a memory replacement on a mother board such as a PC (since the construction (words×bits) of a memory can be set to the module construction itself).

Effects obtained by typical inventions among the inventions disclosed in the present application are simply explained as follows.

(1) Common signal terminals are arranged on one set of two opposed sides, and an independent signal terminal is arranged on another side. The common signal terminals on the two sides are electrically connected to each other by common signal wiring. Accordingly, it is possible to obtain a basic multi-chip TCP in which plural chips are mounted to one tape.

(2) Common signal terminals are arranged on one set of two opposed sides, and an independent signal terminal is arranged on another side. The common signal terminals arranged on one set of two opposed sides are arranged with left-right mirror symmetry. Accordingly, it is possible to obtain a multi-chip TCP able to be divided into two portions. Further, two mirror-symmetrical TCPs can be obtained by cutting the tape at its center. Further, the degree of freedom of a substrate arrangement can be also improved since layout can be performed on the substrate irrespective of front and rear sides, and left and right sides.

(3) Common signal terminals are arranged on one set of two opposed sides, and an independent signal terminal is arranged on another side. Further, leads continuously extend to the common signal terminals and the independent signal terminal, and are projected from the tape. The common signal terminals on the two sides are electrically connected to each other by common signal wiring. Accordingly, a multi-chip TCP of a lead type can be obtained.

(4) Common signal terminals are arranged on one set of two opposed sides, and a first independent signal terminal is arranged on another side. Further, a second independent signal terminal electrically unconnected to a chip mounted to the tape is arranged. A semiconductor device having the common signal terminals, the first independent signal terminal and the second independent signal terminal is laminated. The first independent signal terminal at an upper stage and the second independent signal terminal at a lower stage are connected to each other. The second independent signal terminal at the upper stage and the first independent signal terminal at the lower stage are connected to each other. Accordingly, a multi-chip TCP able to be laminated can be obtained. Further, it is possible to laminate the semiconductor device by a tape-on-tape structure, a lead-on-tape structure or a lead-on-lead structure.

(5) With respect to pads of the chip, a pad connected to the common signal wiring is arranged far from the independent signal terminal, and a pad connected to independent signal wiring is arranged near the independent signal terminal. Accordingly, arranging areas of the common signal wiring and the independent signal wiring of the substrate can be easily separated. Further, it is closer to a pin arrangement of an external terminal arranged on one side of the semiconductor module so that design of the substrate can be simplified.

(6) The common signal wiring and the independent signal wiring formed in the tape are located on the same face, and do not cross each other. Accordingly, the structure of the tape can be simplified. Further, wiring patterns of a ground electric potential and a power electric potential are formed on the same face as the common signal wiring and the independent signal wiring so that the tape structure can be realized by a one-layer tape. Further, a ground electric potential plane pattern and a power electric potential plane pattern are formed on a face opposed to the forming face of the common signal wiring and the independent signal wiring so that the tape structure can be realized by a two-layer tape.

(7) When the tape structure is realized by the two-layer tape and a lead is projected from this tape, the forming size of an outer lead can be changed so that layers can be easily laminated without other independent signal terminals.

(8) When the tape structure is realized by the one-layer tape and a lead is projected from this tape, cost of the tape is reduced, and the lamination of lead-on-lead can be performed through other independent signal terminals. Further, layers can be easily laminated by changing the length of an outer lead without other independent signal terminals.

(9) Since an insulating material is interposed between a main face of the chip and signal wiring of the tape, it is possible to prevent the signal wiring on the tape from being short-circuited so that a main face side of the chip can be mounted onto the tape.

(10) Since chip parts can be mounted to the tape, it is possible to mount a bypass capacitor for a noise measure of a power source, etc.

(11) When plural support leads electrically unconnected to the mounted chip are arranged on another side opposed to a lead of the independent signal terminal, the tape can be supported by the leads of the common signal terminal and the independent signal terminal and the support leads so that the TCP can be stably mounted and mounting property can be improved.

(12) When a frame is arranged so as to surround the chip on one face of the tape, deformation of the tape such as warp, torsion and flexure can be prevented so that the mounting property of the TCP can be further improved. Further, heat radiating property can be also improved by using the frame formed by plastic or a metal having a good heat radiating property.

(13) When a metallic plate is fixedly attached to the chip, deformation of the entire tape is prevented by the metallic plate, and heat generated from the chip can be radiated through the metallic plate so that both mounting property and heat radiating property of the TCP can be improved.

(14) When the tape has a recognizing mark pattern, the tape and the chip can be aligned with each other in position by using the recognizing mark pattern at a bonding time of the inner lead. Further, the recognizing mark pattern can be also used for position alignment in a two-divided package structure.

(15) When the tape has an index for pin display, the direction of a package can be recognized by the index for pin display. Further, the index for pin display can be also used in the two-divided package structure when the direction of the package is recognized.

(16) The independent signal terminal and another independent signal terminal electrically unconnected to the chip mounted to the tape are arranged on another side. Accordingly, the independent signal terminal divisionally drawn out between respective layers of the tape can be connected to the substrate through this another independent signal terminal so that the TCP can be also easily laminated and mounted at a terminal on a tape basic material.

(17) A narrow pad pitch of the chip can be enlarged to a wide outer lead pitch as an interposer structure so that drawing-out of wiring of the substrate can be easily simplified.

(18) Burn-in and electric characteristics tests of plural chips can be simultaneously made so that burn-in and test cost can be reduced.

(19) A basic multi-chip TCP, a multi-chip TCP able to be divided into two portions, a multi-chip TCP of a lead type and a multi-chip TCP able to be laminated are combined and mounted to the rectangular substrate in which plural external terminals are formed on one long side. Thus, it is possible to manufacture a semiconductor module in which these TCPs are mixed with each other. In particular, it is possible to obtain a semiconductor module in which a TCP loaded with plural chips, and TCPs obtained by dividing this TCP into two portions are mixed with each other. Further, in the semiconductor module in which the TCPs are laminated, the plural TCPs can be laminated by a tape-on-tape structure, a lead-on-tape structure, a lead-on-lead structure, or a lead-on-board structure.

(20) Since a resin seal type semiconductor device can be mounted between the external terminal and the plural TCPs, it is possible to obtain a semiconductor module such as a registered DIMM by mounting a TSOP such as a register, a PLL and an inverter.

(21) Since mounting can be performed such that a mounting face of the substrate and a chip main face are facing each other, the chip main face can be protected, and a metallic plate having a heat radiating property can be fixedly attached to a rear face of the chip.

(22) Since an occupying area of the outer lead occupied in one chip is small in comparison with the TCP of one chip, high density mounting to the substrate can be performed so that the semiconductor module can be highly integrated.

(23) Since main wiring is completed on the tape, wiring of the substrate is simplified, and the number of through holes is greatly reduced, and there is a possibility of a reduction in the number of layers of the substrate so that substrate cost can be reduced.

(24) The number of mounted packages and mounting cost can be reduced in comparison with the memory module of the same capacity mounting the memory chip of the same capacity thereto. Further, the number of connection points is reduced, and cost required to inspect a connecting portion is reduced so that mounting cost of the memory module can be reduced.

(25) A large capacity memory module equivalent to the next generation memory module is realized at the same size, and it contributes to the compactness of a system such as a PC and a WS, and an increase in capacity of a built-in memory so that the system can be made compact and increased in capacity.

(26) In the relation of the memory TCP and the memory module, a 64-bit 2-bank can be constructed by a 1-bank 16-bit type and a 2-bank 8-bit type using a collection of four chips, a 1-bank 8-bit type and a 2-bank 4-bit type using a collection of two chips, or a 1-bank 32-bit type and a 2-bank 16-bit type using a collection of eight chips. Accordingly, various kinds of memory TCPs and memory modules can be constructed from the relation of capacity, the number of input and output bits, a bank number, etc.

What is claimed is:

1. A tape carrier type semiconductor device for mounting plural chips to one tape, wherein common signal terminals are arranged on one set of two opposed sides, and an independent signal terminal is arranged on another side, and said common signal terminals on the two sides are electrically connected to each other by common signal wiring; and wherein pads of said chips are set such that a pad connected to said common signal wiring is arranged far from said independent signal terminal, and a pad connected to independent signal wiring is arranged near said independent signal terminal.

2. A tape carrier type semiconductor device for mounting plural chips to one tape, wherein common signal terminals are arranged on one set of two opposed sides, and an independent signal terminal is arranged on another side, and said common signal terminals on the two sides are electrically connected to each other by common signal wiring;

wherein said tape is a two-layer tape; and wherein a ground electric potential plane pattern and a power electric potential plane pattern are formed on a face opposed to a forming face of said common signal wiring and independent signal wiring in said two-layer tape.

3. A tape carrier type semiconductor device for mounting plural chips to one tape, wherein common signal terminals are arranged on one set of two opposed sides, and an independent signal terminal is arranged on another side, and said common signal terminals on the two sides are electrically connected to each other by common signal wiring;

wherein said tape is a two-layer tape; and wherein an insulating material is interposed between a main face of said chip and signal wiring of said two-layer tape.

4. A tape carrier type semiconductor device for mounting plural chips to one tape, wherein common signal terminals are arranged on one set of two opposed sides, and an independent signal terminal is arranged on another side, and said common signal terminals on the two sides are electrically connected to each other by common signal wiring;

wherein a frame is arranged on one face of said tape so as to surround said chip; and wherein said frame is constructed by plastic or a metal having a good head radiating property.

5. A tape carrier type semiconductor device for mounting plural chips to one tape, wherein common signal terminals are arranged on one set of two opposed sides, and an independent signal terminal is arranged on another side, and said common signal terminals on the two sides are electrically connected to each other by common signal wiring; and wherein a metallic plate is fixedly attached to said chip.

6. A tape carrier type semiconductor device for mounting plural chips to one tape, wherein common signal terminals are arranged on one set of two opposed sides, and an independent signal terminal is arranged on another side, and said common signal terminals on the two sides are electrically connected to each other by common signal wiring; and wherein said independent signal terminal and another independent signal terminal electrically unconnected to the chip mounted to said tape are arranged on said another side.

7. A tape carrier type semiconductor device for mounting plural chips to one tape, wherein common signal terminals are arranged on one set of two opposed sides, and an independent signal terminal is arranged on another side, and the common signal terminals arranged on said one set of two opposed sides are arranged with left-right mirror symmetry; and wherein two mirror symmetry tape carrier type semiconductor devices are formed by cutting said tape along a central line on one side on which said independent signal terminal is arranged.

8. The semiconductor device according to claim 7, wherein a recognizing mark pattern is formed in said tape of each of said two mirror symmetry tape carrier type semiconductor devices.

9. The semiconductor device according to claim 7, wherein an index for pin display is formed in said tape of each of said two mirror symmetry tape carrier type semiconductor devices.

10. A tape carrier type semiconductor device for mounting plural chips to one tape, wherein common signal terminals are arranged on one set of two opposed sides, and an independent signal terminal is arranged on another side, and a lead continuously extends to said common signal terminals and said independent signal terminal and is projected from said tape, and said common signal terminals on the two sides are electrically connected to each other by common signal wiring; and wherein pads of said chips are set such that a pad connected to said common signal wiring is arranged far from said independent signal terminal, and a pad connected to independent signal wiring is arranged near said independent signal terminal.

11. A tape carrier type semiconductor device for mounting plural chips to one tape, wherein common signal terminals are arranged on one set of two opposed sides, and an independent signal terminal is arranged on another side, and a lead continuously extends to said common signal terminals and said independent signal terminal and is projected from said tape, and said common signal terminals on the two sides are electrically connected to each other by common signal wiring; and wherein plural support leads electrically unconnected to the mounted chip are arranged on another side opposed to the lead of said independent signal terminal.

12. A tape carrier type semiconductor device for mounting plural chips to one tape, wherein common signal terminals are arranged on one set of two opposed sides, and an independent signal terminal is arranged on another side, and a lead continuously extends to said common signal terminals and said independent signal terminal and is projected from said tape, and said common signal terminals on the two sides are electrically connected to each other by common signal wiring;

wherein a frame is arranged on one face of said tape so as to surround said chip; and wherein said frame is constructed by plastic or a metal having a good heat radiating property.

13. A tape carrier type semiconductor device of a laminating type for mounting plural chips to one tape, wherein a semiconductor device having common signal terminals arranged on one set of two opposed sides, a first independent signal terminal arranged on another side, and a second independent signal terminal electrically unconnected to the chips mounted to said tape is laminated, and the first independent signal terminal at an upper stage and the second independent signal terminal at a lower stage are connected to each other, and the second independent signal terminal at the upper stage and the first independent signal terminal at the lower stage are connected to each other.

14. The semiconductor device of a laminating type according to claim 13, wherein said laminated semiconductor device is laminated by connecting said signal terminals formed on said tape to each other.

15. The semiconductor device of a laminating type according to claim 13, wherein said laminated semiconductor device has a structure in which the signal terminals are formed on the tape at the lower stage, and also has a structure constructed by a lead terminal continuously extending from said signal terminals at the upper stage, and these structures are laminated with each other.

16. The semiconductor device of a laminating type according to claim 13, wherein said laminated semiconductor device has a structure having lead terminals respectively continuously extending from the signal terminals, and is laminated by connecting said lead terminals to each other.

17. The semiconductor device of a laminating type according to claim 13, wherein a recognizing mark pattern is formed in said tape.

18. The semiconductor device of a laminating type according to claim 13, wherein an index for pin display is formed in said tape.

19. A semiconductor module mounting plural tape carrier type semiconductor devices thereto in which plural external terminals are formed on one long side of a rectangular substrate, and common signal terminals are arranged on one set of two opposed sides, and an independent signal terminal is arranged on another side, and said common signal terminals on the two sides are electrically connected to each other by common signal wiring, and plural chips are mounted to one tape, wherein said independent signal terminal is arranged along an arranging direction of said external terminals; and wherein the semiconductor module is constructed by mixing said tape carrier type semiconductor device mounting four chips onto one tape, and a tape carrier type semiconductor device in which common signal terminals are arranged on one set of two opposed sides, and an independent signal terminal is arranged on another side, and the common signal terminals arranged on said one set of two opposed sides are arranged with left-right mirror symmetry, and two chips are mounted onto one tape.

20. A semiconductor module mounting plural tape carrier type semiconductor devices thereto in which plural external terminals are formed on one long side of a rectangular substrate, and common signal terminals are arranged on one set of two opposed sides, and an independent signal terminal is arranged on another side, and a lead continuously extends to said common signal terminals and said independent signal terminal and is projected from a tape, and said common signal terminals on the two sides are electrically connected to each other by common signal wiring, and plural chips are mounted to one tape, wherein said independent signal terminal is arranged along an arranging direction of said external terminals; and wherein the semiconductor module is constructed by mixing said tape carrier type semiconductor device mounting four chips onto one tape, and a tape carrier type semiconductor device in which common signal terminals are arranged on one set of two opposed sides, and an independent signal terminal is arranged on another side, and the common signal terminals arranged on said one set of two opposed sides are arranged with left-right mirror symmetry, and two chips are mounted onto one tape.

21. A semiconductor module constructed by laminating a semiconductor device in which plural external terminals are formed on one long side of a rectangular substrate, and common signal terminals are arranged on one set of two opposed sides, and a first independent signal terminal is arranged on another side, and a second independent signal terminal electrically unconnected to a chip mounted to a tape is arranged; and mounting plural tape carrier type semiconductor devices in which the first independent signal terminal at an upper stage and the second independent signal terminal at a lower stage are connected to each other, and the second independent signal terminal at the upper stage and the first independent signal terminal at the lower stage are connected to each other, and plural chips are mounted to one tape, wherein said independent signal terminal is arranged along an arranging direction of said external terminals.

22. The semiconductor module according to claim 21, wherein each of said plural tape carrier type semiconductor devices is laminated by connecting said signal terminals formed on said tape to each other.

23. The semiconductor module according to claim 21, wherein each of said plural tape carrier type semiconductor devices has a structure in which the signal terminals are formed on the tape at the lower stage, and also has a structure constructed by a lead terminal continuously extending from said signal terminals at the upper stage, and these structures are laminated with each other.

24. The semiconductor module according to claim 21, wherein each of said plural tape carrier type semiconductor devices has a structure having lead terminals respectively continuously extending from the signal terminals, and is laminated by connecting said lead terminals to each other.

25. The semiconductor module of a lead-on-board structure according to claim 21, wherein each of said plural tape carrier type semiconductor devices has a structure having lead terminals respectively continuously extending from the signal terminals, and is laminated onto the mounting substrate such that said lead terminal of the tape carrier type semiconductor device mounted at the upper stage lies across said lead terminal of the tape carrier type semiconductor device mounted at the lower stage.

26. The semiconductor module according to claim 25, wherein a lead of said tape carrier type semiconductor device at the upper stage is longer in said lead-on-board structure.

27. The semiconductor module according to claim 21, wherein a resin seal type semiconductor device is mounted between said external terminals and said plural tape carrier type semiconductor devices.

28. The semiconductor module according to claim 21, wherein the semiconductor module is constructed by mixing said tape carrier type semiconductor device mounting four chips onto one tape, and a tape carrier type semiconductor device in which common signal terminals are arranged on one set of two opposed sides, and an independent signal terminal is arranged on another side, and the common signal terminals arranged on said one set of two opposed sides are arranged with left-right mirror symmetry, and two chips are mounted onto one tape.

29. The semiconductor module according to claim 21, wherein a mounting face of said substrate and a chip main face are mounted such that these faces are facing each other.

30. A tape carrier type semiconductor device for mounting plural chips to one tape, wherein common signal terminals are arranged on one set of two opposed sides, and an independent signal terminal is arranged on another side, and a lead continuously extends to said common signal terminals and said independent signal terminal and is projected from said tape, and said common signal terminals on the two sides are electrically connected to each other by common signal wiring; and wherein a metallic plate is fixedly attached to said chip.

* * * * *